United States Patent [19]
Frey

[11] Patent Number: 5,933,902
[45] Date of Patent: Aug. 10, 1999

[54] WAFER CLEANING SYSTEM

[76] Inventor: Bernhard M. Frey, 2536 Piedmont Ave. Apt #2, Berkeley, Calif. 94704

[21] Appl. No.: 08/972,775

[22] Filed: Nov. 18, 1997

[51] Int. Cl.$^6$ ............................... B08B 1/04; B08B 3/00; B08B 11/00
[52] U.S. Cl. .............................................. 15/102; 15/97.1
[58] Field of Search ................................ 15/51, 97.1, 99, 15/102, 103.5

[56] References Cited

U.S. PATENT DOCUMENTS

| | | | |
|---|---|---|---|
| 4,911,761 | 3/1990 | McConnell et al. | 134/11 |
| 5,361,449 | 11/1994 | Akimoto | 15/302 |
| 5,468,302 | 11/1995 | Thietje | 134/1 |
| 5,475,889 | 12/1995 | Thrasher et al. | 15/88.3 |
| 5,486,134 | 1/1996 | Jones et al. | 451/209 |
| 5,529,638 | 6/1996 | Lutz | 134/6 |
| 5,539,995 | 7/1996 | Bran | 34/77 |
| 5,542,441 | 8/1996 | Mohindra et al. | 134/95.2 |
| 5,547,515 | 8/1996 | Kudo et al. | 134/21 |
| 5,556,479 | 9/1996 | Bran | 134/1.3 |
| 5,571,337 | 11/1996 | Mohindra et al. | 134/25.4 |
| 5,624,501 | 4/1997 | Gill, Jr. | 134/6 |
| 5,639,311 | 6/1997 | Holley et al. | 134/6 |
| 5,868,857 | 2/1999 | Moinpour et al. | 15/102 X |

FOREIGN PATENT DOCUMENTS

| 996462 | 12/1951 | France | 15/97.1 |
|---|---|---|---|
| 57-54325 | 3/1982 | Japan | 15/97.1 |

OTHER PUBLICATIONS

Jerald A. Britten, "A moving–zone Marangoni drying process for critical cleaning and wet processing," Solid State Technology, Oct. 1997, pp. 143–148.

YieldUP, Omega 2000, YieldUP International, 117 Easy Street, Mountain View, California USA 94043, Bulletin No. D0013–6/96E, (2 pages).

*Primary Examiner*—Mark Spisich
*Attorney, Agent, or Firm*—Skjerven, Morrill, MacPherson, Franklin & Friel LLP; David E. Steuber

[57] ABSTRACT

A wafer cleaning and drying apparatus comprises a vertical wafer drive assembly, providing two-sided wafer cleaning by symmetrically disposed brushes. Each wafer brush comprises two parallel rotatable shafts within the lumen of a substantially tubular sponge, with an adjustable distance between the two shafts, which is narrowed to facilitate insertion into the sponge and widened to stretch the sponge into a substantially oval cross-sectional shape, thereby improving traction. One or more nonrotating perforated fluid delivery tubes are mounted within the lumen of the sponge in the space between the two shafts. The apparatus further comprises a minimal volume rinse/dry enclosure that conserves water and process chemicals; and a wafer transport assembly configured to transfer multiple wafers simultaneously between multiple process stations.

14 Claims, 19 Drawing Sheets

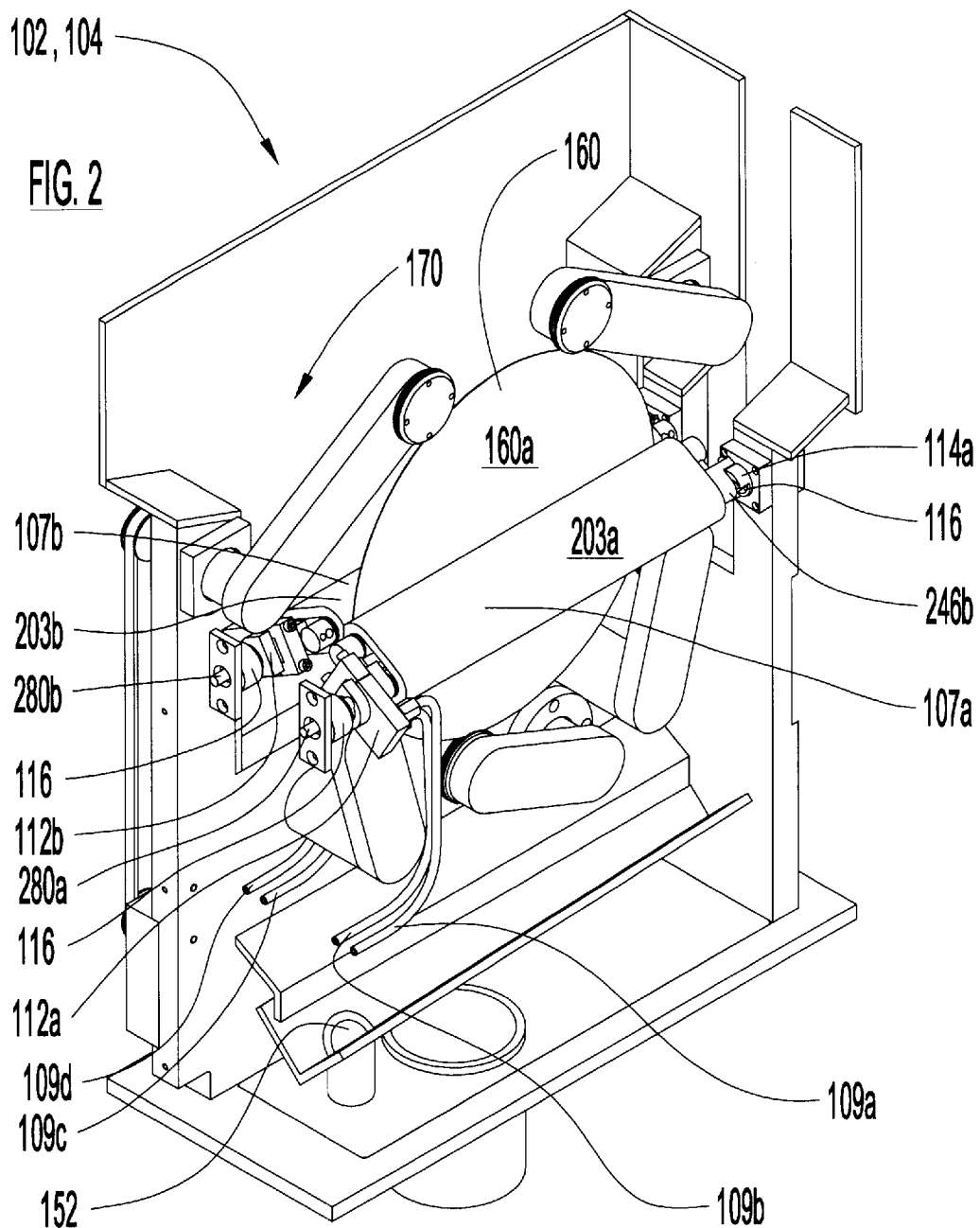

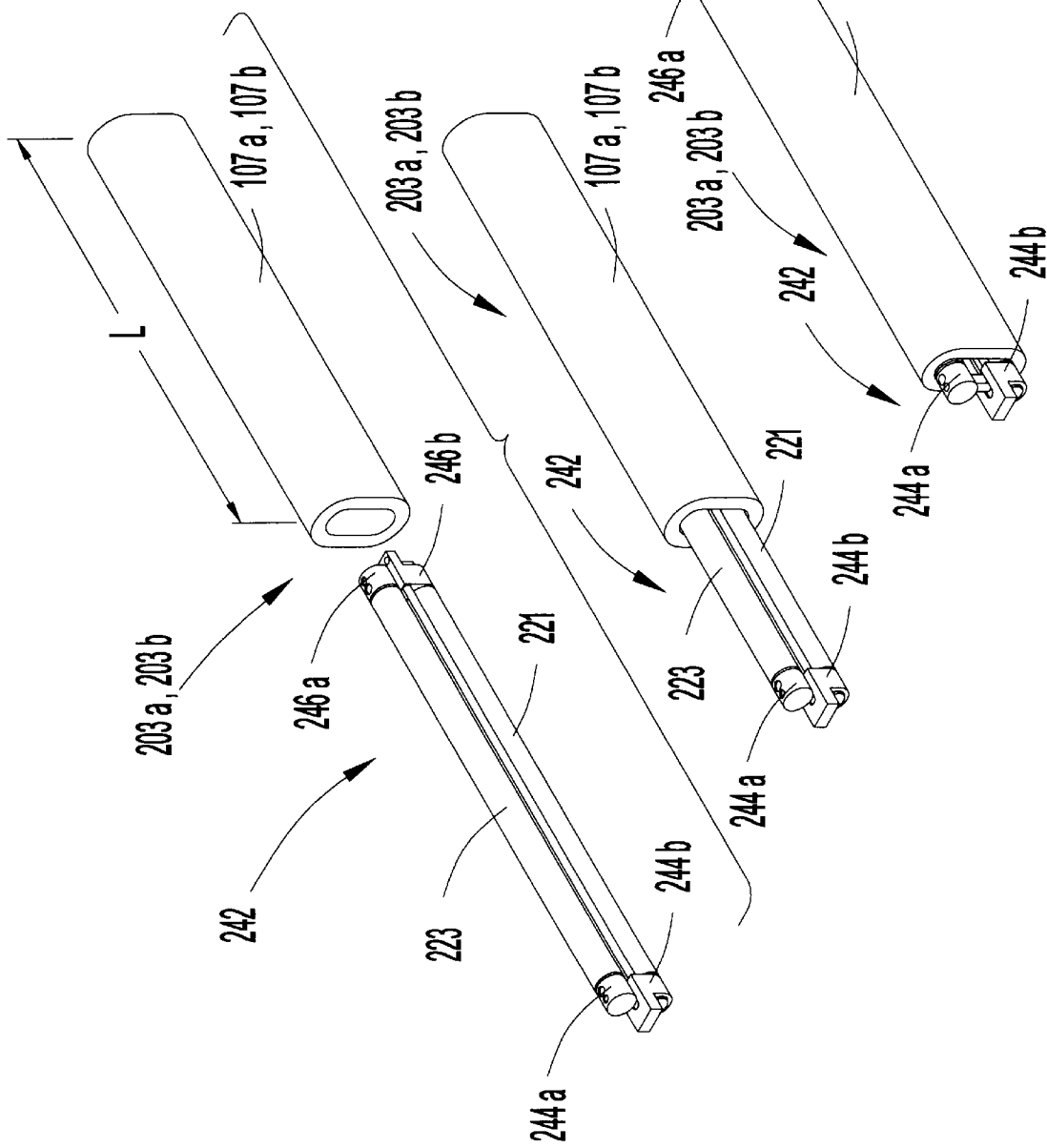

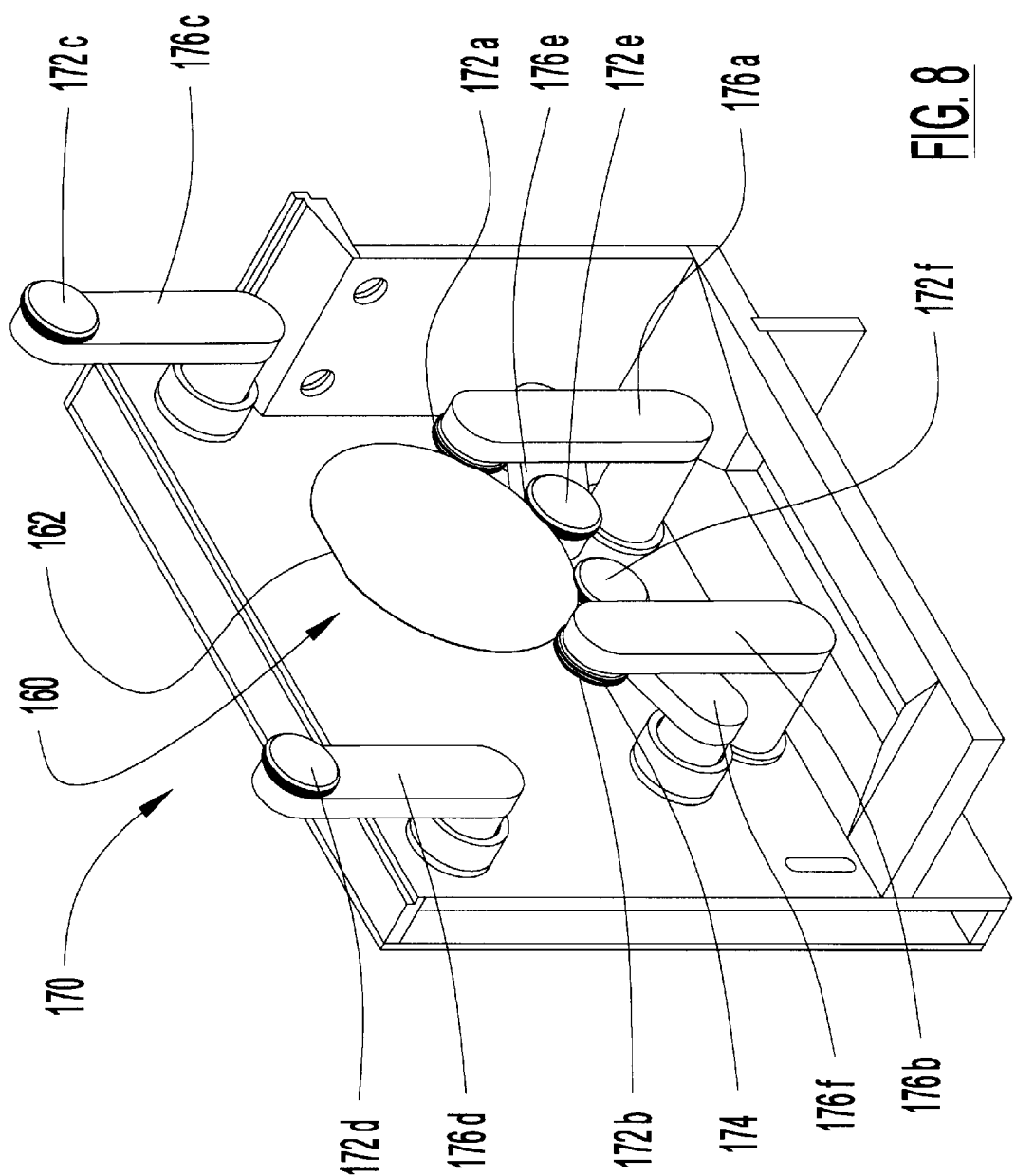

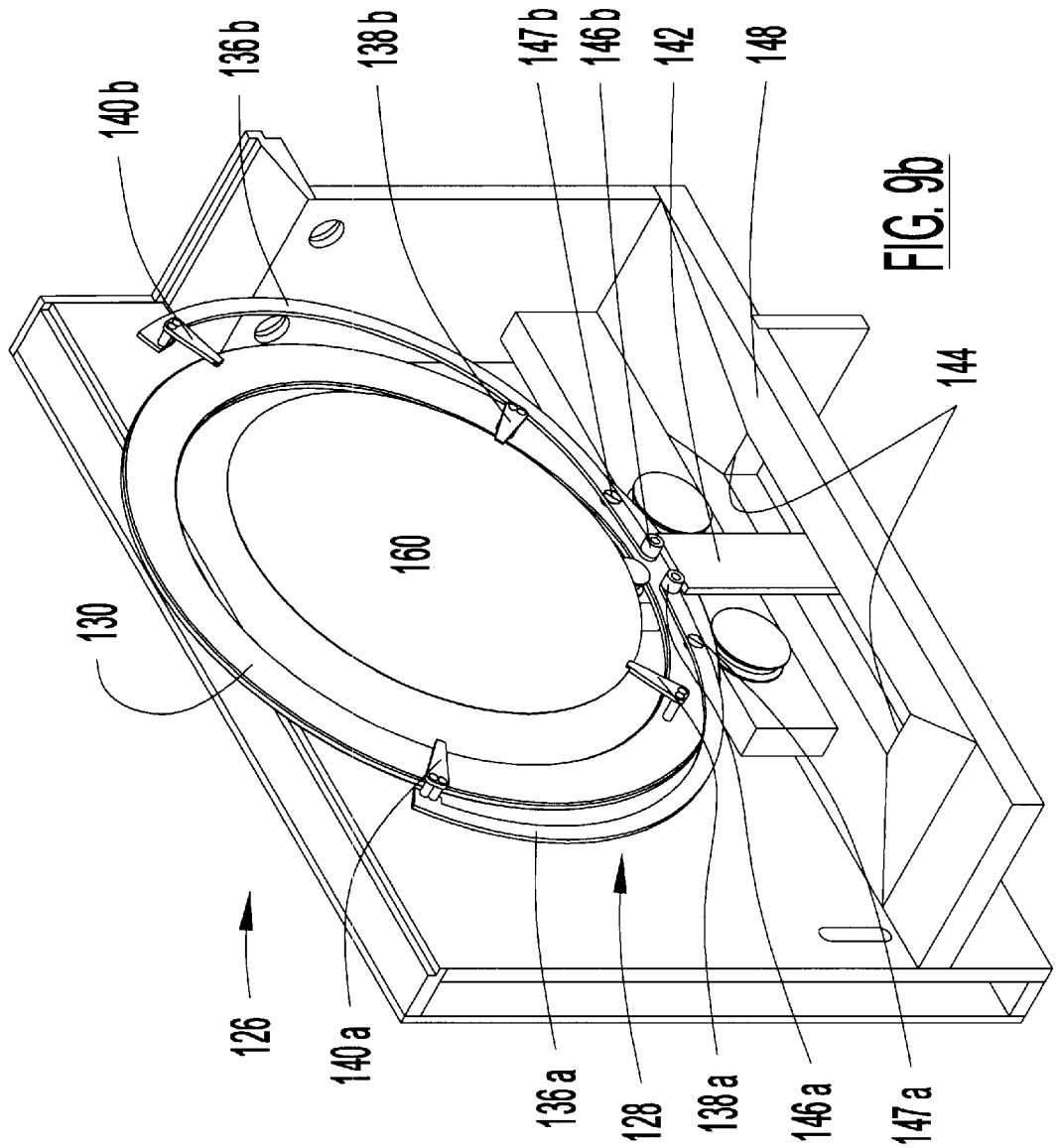

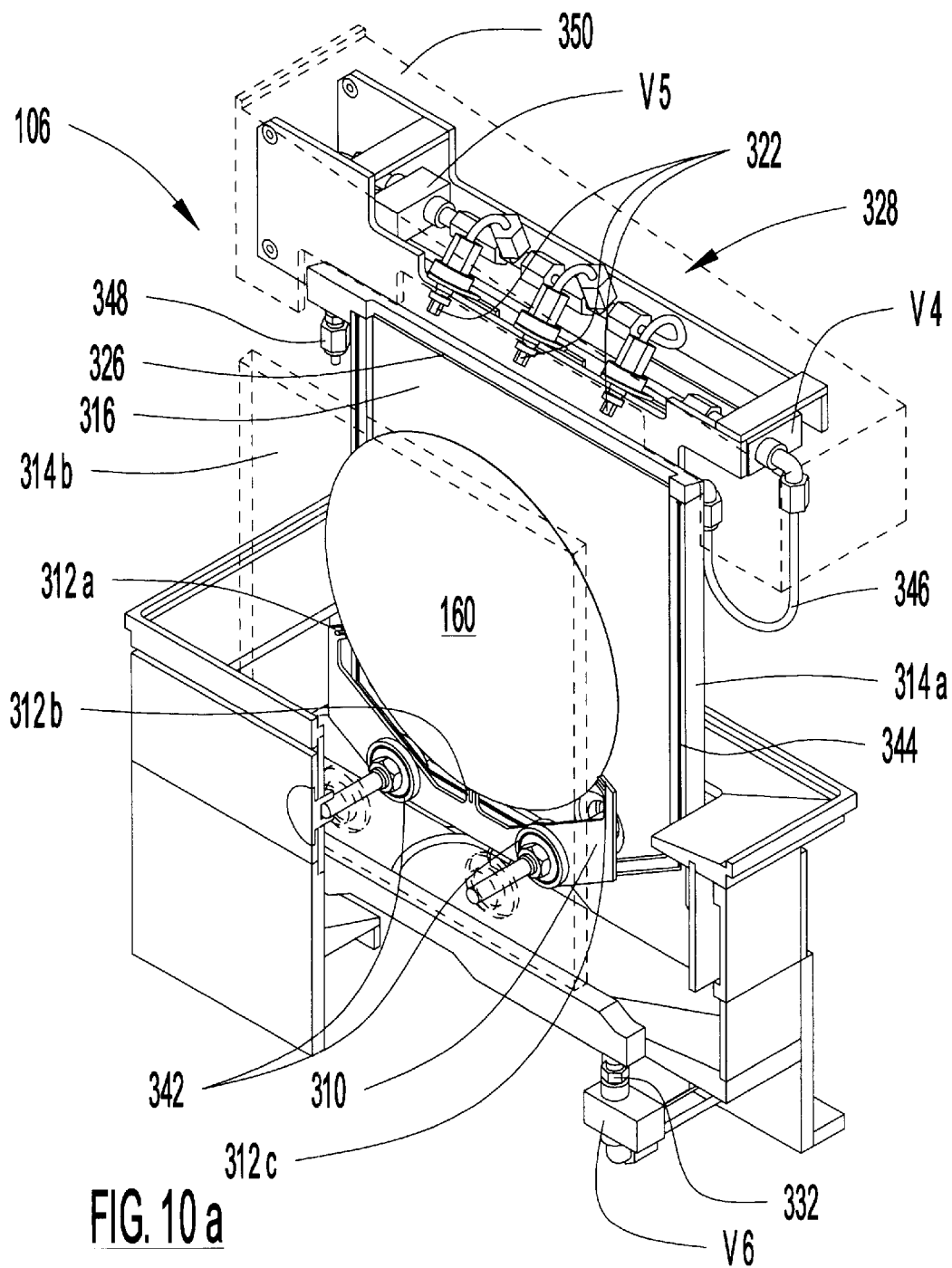

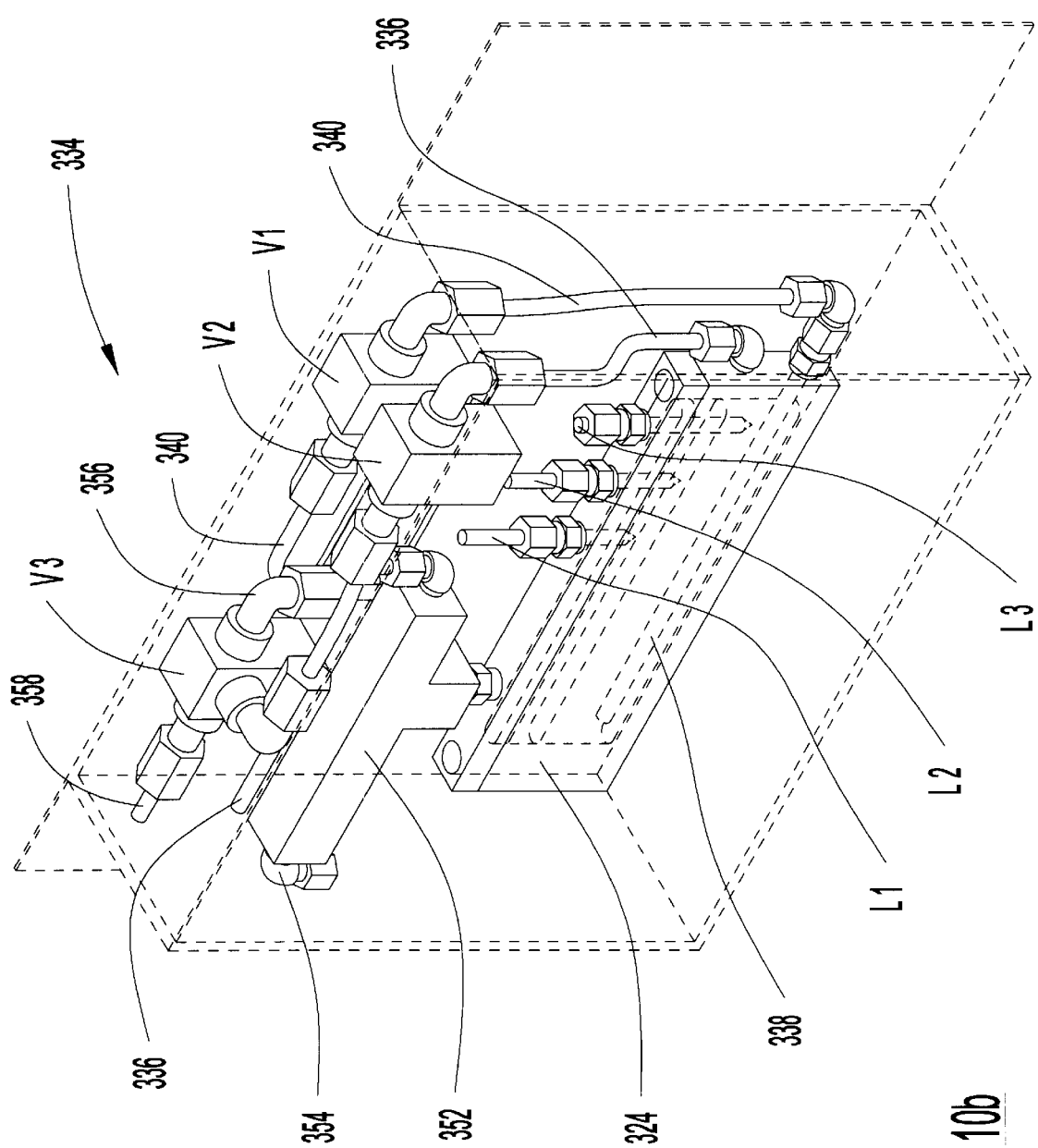

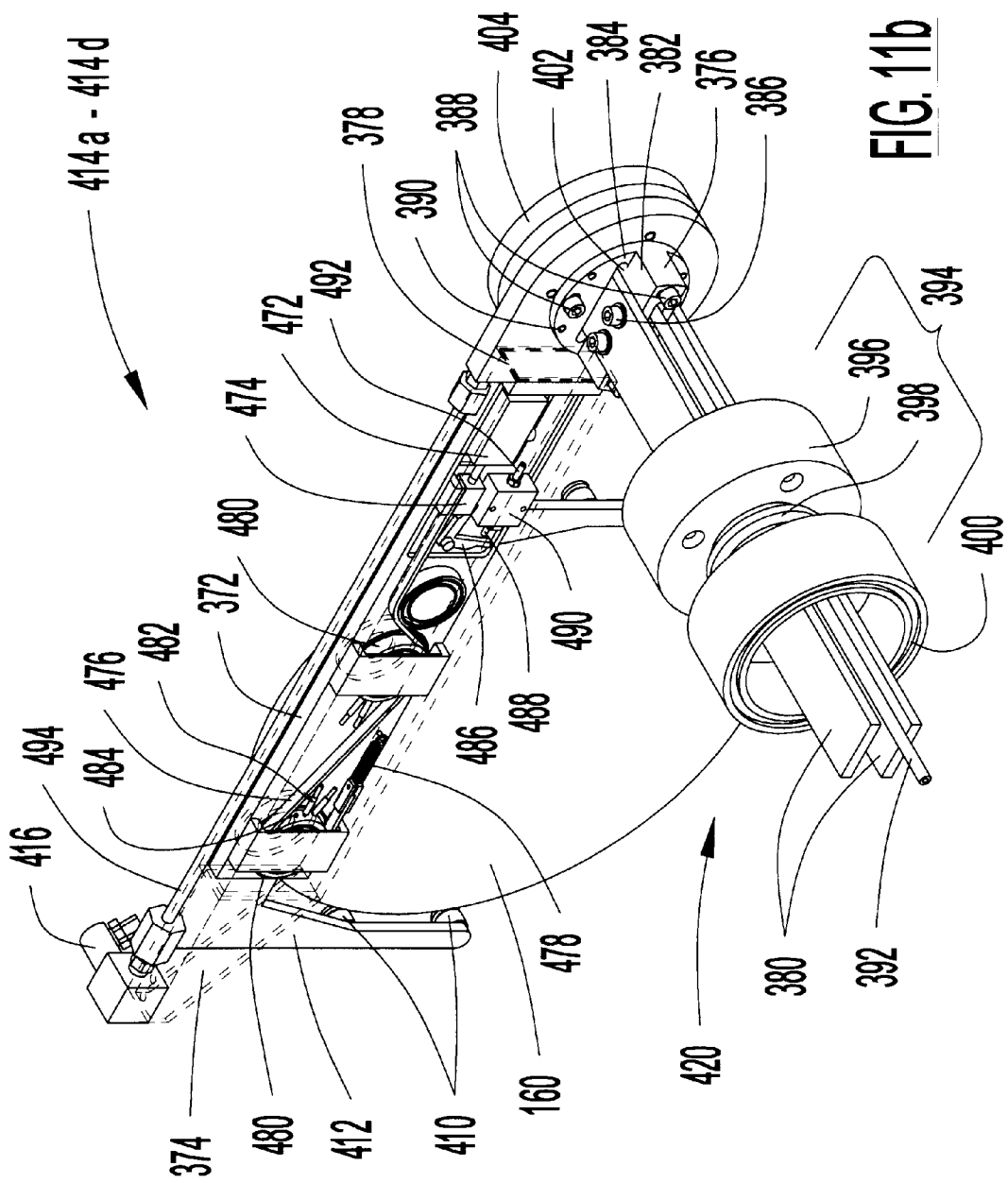

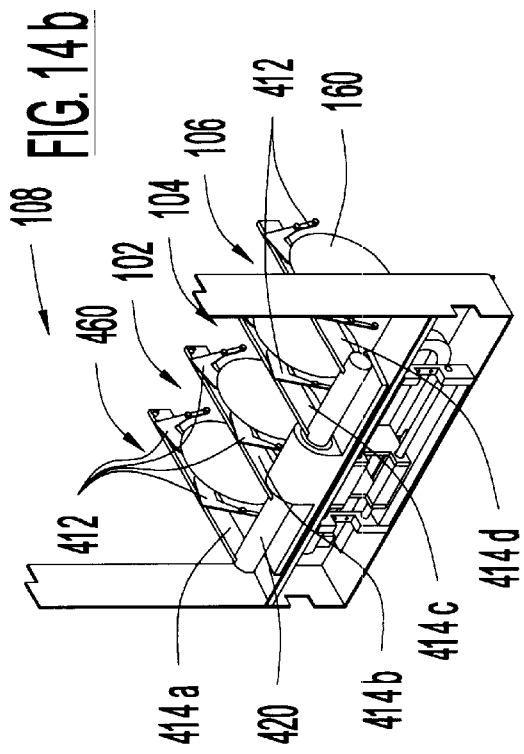
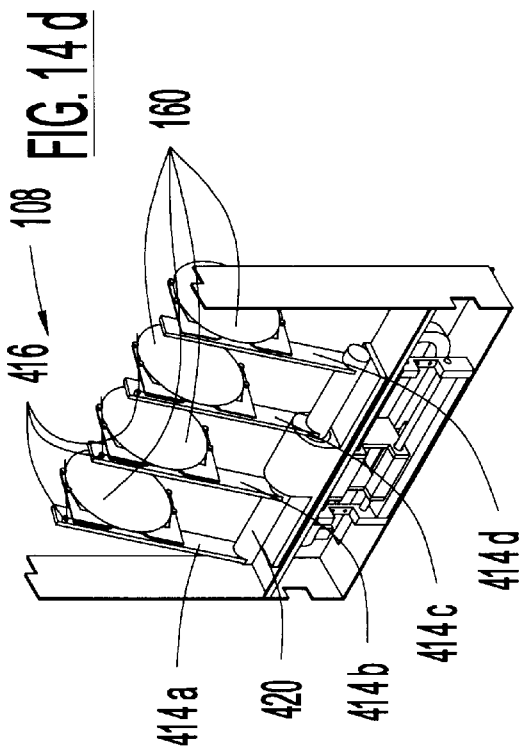
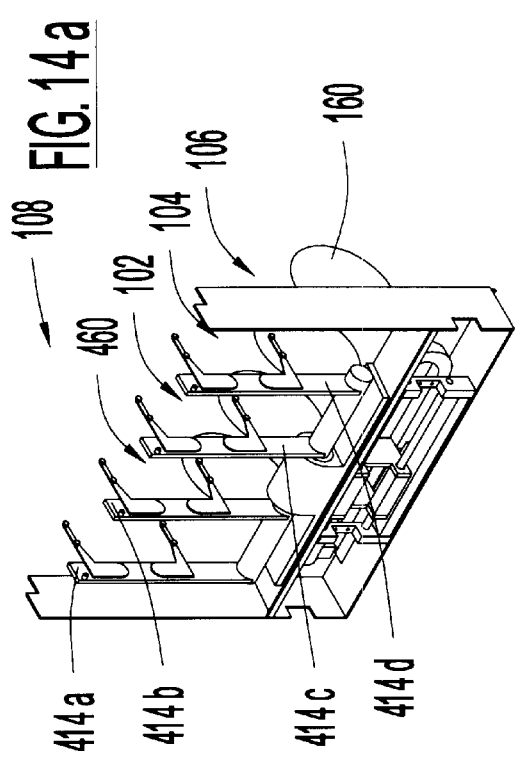
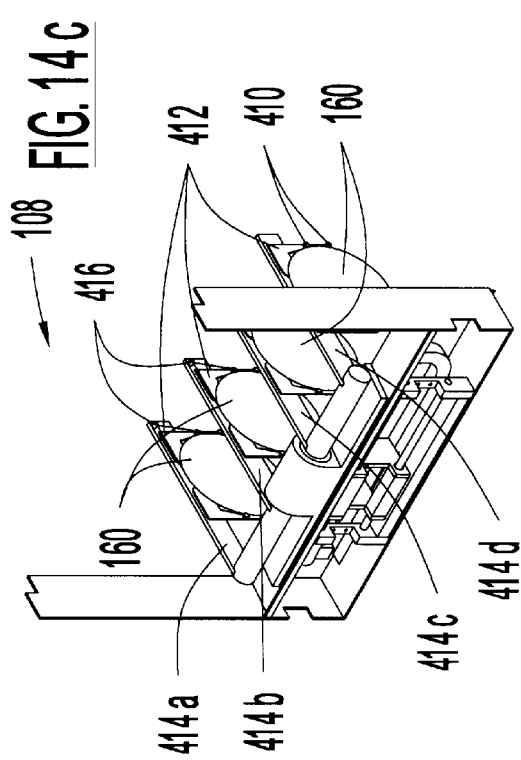

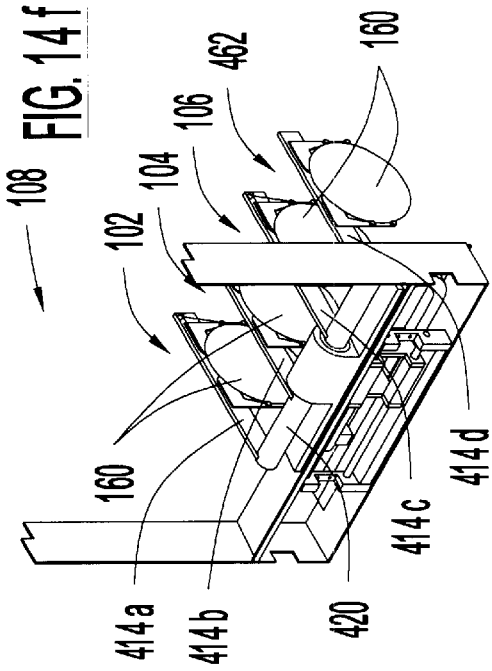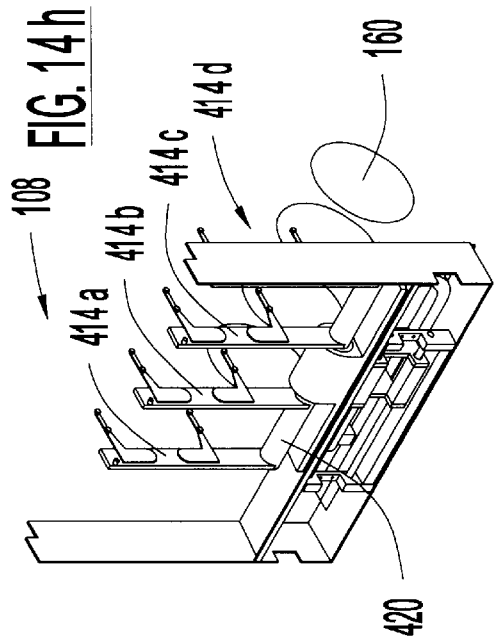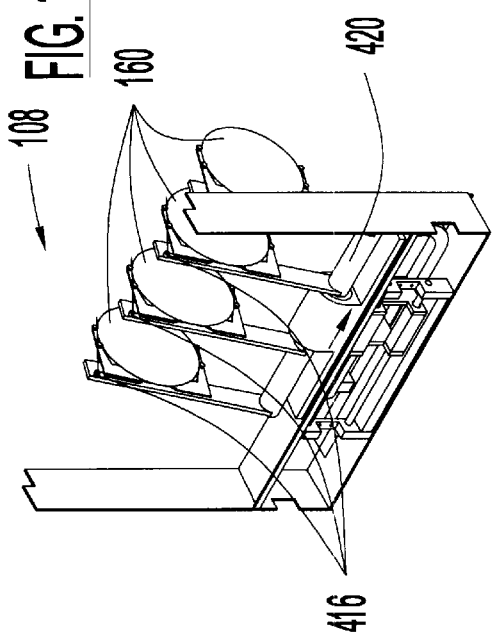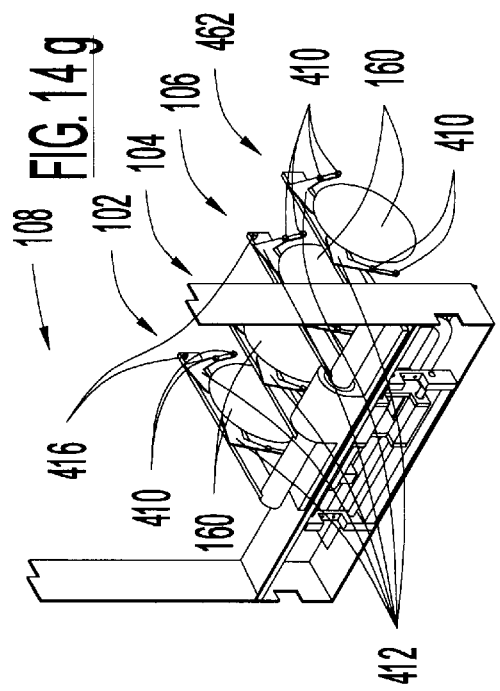

WAFER CLEANING SYSTEM

FIELD OF THE INVENTION

This invention relates to cleaning and drying of silicon semiconductor wafers. More particularly, this invention relates to apparatus for cleaning and drying a semiconductor wafer.

BACKGROUND OF THE INVENTION

Conventional semiconductor wafer cleaning apparatus suffers from a variety of general drawbacks. These include less than desired production throughput; excessive downtime for maintenance; inadequately clean wafers due to inefficient surface scrubbing, contaminant removal, and debris removal; excessive wafer breakage; lack of flexibility of configuration and control to handle a variety of wafer sizes and geometries; excessive consumption of processing fluids and other consumables; excessive generation of emissions and other industrial wastes; and excessive demand on manufacturing floor space.

Conventional wafer cleaning apparatus normally uses PVA (Polyvinyl Alcohol) sponges as the cleaning elements. Conventional wafer cleaning machines present several sponge related problems, including relatively short sponge service life due to particle buildup and excessive downtime and handling requirements in conventional sponge replacement, leading to long process requalification time. Moreover, conventional sponges are stretched onto a single shaft, which is normally oversized in order to avoid slippage between the sponge and the shaft under load.

The stretching of a sponge over a single oversized shaft in the prior art is a difficult operation and typically results in the surface of the sponge becoming lumpy and unevenly distributed on the shaft. The resulting uneven sponge distribution often leads to non-uniform contact pressure between a rotating sponge and wafer, increasing the risk of wafer breakage. Such nonuniformity and lumpiness impede the ability of the sponge to uniformly clean a wafer surface. Moreover the inability to have a repeatable surface texture when sponges are replaced on the core degrades the ability to predict the results of the cleaning process. Additionally, single-shaft mounted sponges on conventional machines are generally not efficiently rinsed, leading to contaminant buildup on the wafer and further contributing to shortened sponge life. Some cleaning equipment manufacturers rinse the sponge from the inside through a single shaft, requiring rotary fluid feedthroughs.

Conventional wafer cleaning apparatus generally operates with the plane of the wafer oriented horizontally. This horizontal orientation occupies more floor space than is desirable and is typically difficult to maintain, adversely affecting throughput. Horizontal wafer orientation further impedes efficient flushing away of contaminants and debris. Gill U.S. Pat. No. 5,624,501 describes a wafer cleaning apparatus with vertically wafer orientation and two-sided brush cleaning, in which the opposed brushes are conically shaped. Kudo et al. U.S. Pat. No. 5,547,515 describes a wafer cleaning method with vertically oriented wafers and simultaneous two-sided brush cleaning between counter-rotating tubular shaped brushes mounted on single shafts in a bath. Jones et al. U.S. Pat. No. 5,486,134 describes a method for texturing magnetic data storage disks, wherein the disk is oriented vertically between counter-rotating tubular shaped brushes mounted on single shafts and rotating in an upward direction along their respective lines of contact with the disk. Thrasher et al. U.S. Pat. No. 5,475,889 describes a brush assembly for cleaning horizontally oriented wafers between tubular shaped counter-rotating brushes, wherein the brushes are mounted respectively on single shafts. Holley et al. U.S. Pat. No. 5,639,311 describes a method for cleaning horizontally oriented wafers between tubular shaped counter-rotating brushes, wherein the brushes are mounted respectively on single shafts and are irrigated internally with cleaning fluids. Akimoto U.S. Pat. No. 5,361,449 describes apparatus for cleaning horizontally oriented stationary wafers on the bottom surface only, using a planetary mounted brush rotating in a plane parallel to the wafer surface. Convac GmbH (Germany) previously used a horizontally oriented non-interchangeable wafer mounting ring for double-sided wafer cleaning.

Many conventional wafer cleaning systems support and rotate the wafer on its circumference using two or three grooved rolls. This drive arrangement is, however, subject to slippage, which may generate contaminant particles and stresses that lead to wafer breakage. The conventional wafer support and drive arrangement is also difficult to adapt to a variety of wafer sizes and shapes. Particularly, it is difficult to support and rotate wafers having flats or notches on their edges without generating mechanical shocks that increase the risk of wafer breakage.

Conventional wafer drying apparatus frequently involves wafer spin/rinse cycles in which the wafers are mechanically moved, increasing the risk of breakage. In addition, high drying temperatures encountered in some wafer dryers may generate thermal stresses that further aggravate the risk of wafer breakage. Also, the spin/rinse cycles may damage photoresist on patterned resist wafers. McConnell et al. U.S. Pat. No. 4,911,761 and Mohindra et al. U.S. Pat. No. 5,571,337 describe processes for drying without spinning, involving immersion in a rinse fluid followed by displacement of the rinse fluid by a drying vapor. Bran U.S. Pat. No. 5,539,995 describes a system for wafer drying without spinning, involving exposure of the wafer to a flowing vapor stream. Bran U.S. Pat. No. 5,556,479 describes a method and apparatus for wafer drying without spinning, involving immersion in a rinse fluid that is subsequently displaced by a drying vapor, in which the wafer surface is heated radiantly. Several equipment manufacturers, for example Verteq Inc. of Santa Ana, Calif. USA; YieldUP International of 117 Easy Street, Mountain View, Calif. USA 94043 (see for example bulletin D0013-6/96E), and Steag Microtech, of Germany offer a "MARANGONI" type rinse/dry system in which the wafer remains motionless during the procedure and is dried using low-temperature dilute amounts of isopropyl alcohol in a nitrogen carrier gas. Although this system reduces wafer breakage and chemical consumption, it typically involves relatively large processing chambers, and thus could benefit from further reduction in size to reduce chemical consumption and manufacturing floor space demands.

Conventional wafer cleaning transport assemblies are cumbersome, poorly integrated into process requirements and apparatus, subject to contamination, and excessively demanding of manufacturing floor space. Some wafer transport assemblies require wafers to be transported singly or collectively in cassettes or baskets. Thietje U.S. Pat. No. 5,468,302 describes a wafer transport assembly, wherein vertically oriented wafers are individually moved between process stations using a pair of independent robotic devices sliding on a common rail. Lutz U.S. Pat. No. 5,529,638 describes a wafer transport method, wherein wafers are individually floated along a fluid track. Kudo et al. U.S. Pat. No. 5,547,515 describes a method for wafer transport, wherein wafer edges are gripped between elastically deformable arms that move linearly with respect to each other to engage and release the wafer edges.

Accordingly the art needs a semiconductor cleaning and drying apparatus having increased production throughput; lower downtime for maintenance; more efficient contamination control, surface scrubbing, and debris removal; reduced wafer breakage; greater flexibility of configuration and control to handle a larger variety of wafer sizes and geometries; lower consumption of processing fluids and other consumables; lower generation of emissions and other industrial wastes; and lower demand on manufacturing floor space.

Particularly, the art needs a new sponge assembly configuration that reduces handling, eliminates distortion of the sponge, promotes efficient rinsing and flushing of particles and other contaminants, and increases service life between sponge replacements. Also needed is an apparatus to overcome the drawbacks in conventional horizontal wafer support and rotation arrangements, including limited brush access, inefficient rinsing and flushing, drive slippage and particle generation, and limitations in sizes and shapes of wafers that can be accommodated. Further needed is a rinse/dry apparatus that minimizes floor space requirements and process chemical consumption, at the same time keeping the wafer motionless and avoiding high temperatures. Additionally needed is a wafer transport apparatus occupying a minimal footprint, capable of efficiently transferring multiple wafers simultaneously among multiple process sites.

SUMMARY OF THE INVENTION

In accordance with the present invention, a wafer cleaning and drying apparatus comprises a wafer drive assembly that orients and supports a wafer in a vertical plane, providing simultaneous access for wafer cleaning brushes disposed symmetrically on both planar surfaces of the wafer. The symmetric configuration balances stresses on the wafer surfaces and reduces breakage. Each wafer brush comprises two parallel rotatable shafts, one of which is driven externally. Both shafts are mounted within the lumen of a substantially tubular sponge (or other similar soft, porous, and resilient material), with an adjustable distance between the two shafts that is made narrower to facilitate insertion of the shafts into the lumen of the sponge and is made wider, stretching the sponge into a substantially oval cross-sectional shape, to provide traction between the rotating shafts and the tubular sponge. One or more perforated fluid delivery tubes are also mounted within the lumen in a space between the shafts, but do not rotate with the shafts, thereby requiring no rotary fluid feedthroughs.

In operation, as the wafer rotates in a vertical plane, the sponges rotate in mutually opposite directions in a belt-like configuration about their respective shafts, both parallel to the surfaces of the wafer, such that each sponge is traveling downward along the line of contact with the wafer. In this manner contaminants are carried downward from the wafer surface into a drain. Concurrently fluid is dispensed from the fluid delivery tube to irrigate the sponge from the inside surface just after the sponge passes over a rotating shaft. This irrigation can take place following contact of the sponge with either or both of the rotating shafts, and can result in a beneficial cycle of irrigation and squeezing, as the sponge is alternately compressed during contact with the shafts and expanded between the shafts.

At the end of a cleaning cycle the wafer cleaning brushes are each mounted to swivel away from contact with the wafer surfaces about one of their respective rotation axes, thereby providing access to load and unload wafers in the wafer drive assembly.

In accordance with an embodiment, the wafer drive assembly rotates the wafer on six grooved rolls contacting the edge of the wafer. Each roll is mounted to a swivelable arm assembly, through which the rolls are coupled to pulleys that are simultaneously driven by a single belt or other conventional means. The swivelable arms are linked in pairs, so that both arms of a given pair are constrained to swivel symmetrically. This permits a linked pair of arms to swivel symmetrically away from the wafer drive assembly to allow access for loading and unloading wafers. It also prevents the wafer from jumping toward a roll that is being passed by a flat, since the linked pair configuration guarantees that the other five rolls remain in contact with the edge of the wafer. Additionally it provides for easy adjustment to accommodate different wafer sizes.

In accordance with a further embodiment, the wafer drive assembly comprises a rotating ring assembly clamping the edge of the wafer with slidable clamps mounted on a preloaded torsion spring lever swivelably mounted to an annular ring. The annular ring rotates on three rolls, one of which is driven externally. When the annular ring is stationary in a "home" position, an actuator applies pressure laterally against contact pins mounted to the torsion spring levers, overcoming the preload spring tension and causing the spring levers to swivel, withdrawing the slidable clamps from the edge of the wafer. This configuration allows for flexible interchange of ring assemblies tailored for specific different wafer sizes and shapes. Additionally the single roll drive guarantees slip free rotation and consequently potentially reduced generation of contaminant particles.

In accordance with an embodiment, the apparatus comprises a compact rinse/dry module, in which the wafer is held stationary within a sealed enclosure, where it is immersed in a fluid, e.g. deionized water, and then dried by exposure to a chemical vapor, e.g. isopropyl alcohol in a nitrogen carrier gas. The enclosure is dimensioned with a minimal inner volume closely coupled about the wafer, thereby minimizing water and process chemical consumption. Rinsing and drying in single-wafer-per-fill batches reduces the risk of cross contamination.

The enclosure divides into two portions, which separate to provide access for loading and unloading the wafer. The rinse/dry module further comprises one or more fluid dispensing nozzles adjacent and directed onto the wafer and the inner surface of the enclosure, maintaining moisture, thoroughly rinsing, and flushing away contaminants prior to sealing the wafer inside the enclosure for drying. The fluid dispensing nozzles are turned off during and after drying of the wafer.

In accordance with an embodiment, the apparatus further comprises a wafer transport assembly having a substantially cylindrical spacing bar rotatably mounted in a transport housing translatable parallel to the spacing bar. At least two parallel lever assemblies are attached radially to the spacing bar. Distal to the spacing bar each lever assembly is swivelably connected to two end effectors. Grooved cylinders attached to the end effector grip the edge of a wafer in a precise position and orientation, when the end effectors are swiveled closed and release the wafer when the end effectors are swiveled open.

Fluid dispensing nozzles attached respectively to all but one of the lever assemblies spray and moisten the wafers continuously during transport.

In normal operation the transport housing starts at a home position with lever assemblies oriented vertically and the end effectors swiveled open. The spacing bar rotates the lever assemblies into the horizontal plane. End effectors are then swiveled into the closed position, thereby enabling simultaneous capturing of wafers from multiple modules. The spacing bar then rotates the lever assemblies into the vertical plane, removing the wafers. Then the housing translates the assembly by one module width, the lever arms are rotated into the horizontal plane, and the end effectors are opened, placing the wafers in their respective next modules. After delivering the wafers, the lever assemblies are rotated again to the vertical plane, and the housing translates back to the "home" position. This final translation may occur simultaneously with the ongoing processing of the wafers in the modules, thereby reducing wafer handling overhead and improving throughput.

At the beginning of a production cycle, only the first module contains a wafer. During the first transport cycle, the wafer transport assembly captures and transfers the single wafer from the first module to the second module. During the second transport cycle, the wafer transport assembly captures and transfers the first wafer from the second module to the third module and simultaneously captures and transfers a second wafer from the first module to the second module. At each successive transport cycle the wafer transport assembly transfers one additional wafer, until every module contains a wafer. At the end of a production cycle the wafer transport assembly transfers one less wafer at each successive transport cycle, until only the last module contains a wafer.

BRIEF DESCRIPTION OF THE DRAWINGS

FIG. 2 is a cutaway isometric view of a brush station module in accordance with an embodiment of the present invention.

FIG. 3a is an isometric view of a brush assembly prior to insertion into a sponge.

FIG. 3b is an isometric view of a sponge partially slipped around the shafts of a brush assembly.

FIG. 3c is an isometric view of a sponge mounted in operating position around a brush assembly.

FIG. 8 is a cutaway isometric view of a vertical wafer drive apparatus, in accordance with an embodiment of the invention.

FIG. 9b is a cutaway isometric view of an alternative clamp ring embodiment of a wafer drive apparatus, shown in a loading and unloading configuration.

FIG. 10a is a cutaway isometric view of a rinse/dry station module in accordance with an embodiment of the invention, shown with one containment chamber shaded for clarity.

FIG. 10b is a cutaway isometric view of an IPA vapor source assembly in accordance with an embodiment of the invention.

FIG. 11b is a cutaway isometric view of the detailed structure of the lever assembly and spacing bar of FIG. 11a, in accordance with an embodiment of the invention.

FIG. 14a is an isometric view of the wafer transport apparatus of FIG. 11a in one end position at the beginning of a transport cycle (home position), in accordance with the present embodiment.

FIGS. 14b–14h are isometric views of the wafer transport apparatus of FIG. 11a at further stages of the transport cycle, in accordance with the present embodiment.

DETAILED DESCRIPTION OF THE EMBODIMENTS

Figure 1:
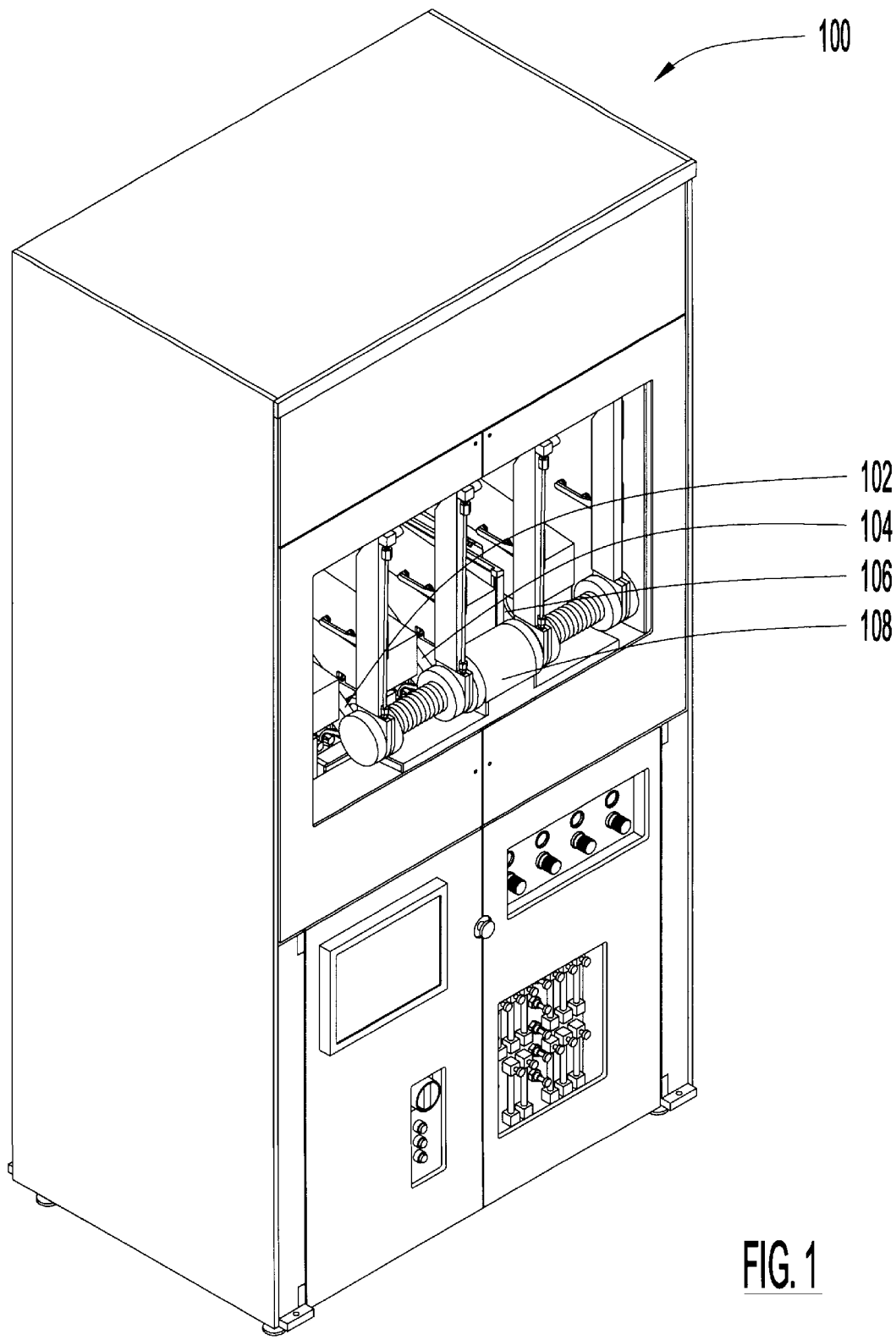
FIG. 1 is an isometric view of a modular embodiment of a wafer cleaning and drying apparatus in accordance with the present invention.

FIG. 1 is an isometric view of a modular embodiment of a wafer cleaning and drying apparatus 100 in accordance with the present invention. Illustratively wafer cleaning and drying apparatus 100 comprises a first brush station module 102, a second brush station module 104, a rinse/dry station module 106, and a wafer transport apparatus 108. Modules 102, 104, 106, and apparatus 108 may be packaged as illustrated in FIG. 1 or in any other desired manner, including as individual modules. Wafer cleaning and drying apparatus 100 may comprise more or fewer than one module of each type, and may additionally comprise modules of other types (not shown). Modules of the same type, e.g., brush station modules 102, 104, may be identical to one another or may differ in structural details, in function, or in process materials and variables such as fluids, sponges, pressures, and rotation speeds.

Illustratively, although two brush station modules 102, 104, may be advantageous to perform a prewash and a separate final wash for improved wafer cleanliness and manufacturing throughput (e.g. to keep pace with other manufacturing processes such as wafer polishing), wafer cleaning and drying apparatus 100 may alternatively incorporate only one brush station module.

FIG. 2 is an isometric view of brush station module 102, 104 in accordance with an embodiment of the present invention. A wafer 160 is supported and rotated in a vertical plane by a wafer drive apparatus 170. Two wafer cleaning brushes 203a and 203b perform a contact scrubbing action simultaneously on parallel wafer surfaces 160a and 160b (not shown), respectively, of wafer 160.

FIGS. 3a–3c are isometric views of wafer cleaning brushes 203a, 203b during progressive stages of assembly. Each wafer cleaning brush 203a, 203b comprises two rotatable shafts (also referred to as cores), namely a master shaft 221 and a slave shaft 223, which are mounted parallel to each other in a brush assembly 242 further comprising end blocks 244a, 244b and 246a, 246b. Master shaft 221 is driven by a rotary drive mechanism (not shown) coupled to an end of master shaft 221.

Brush assembly 242 is inserted into a substantially tubular sponge or other similar soft, porous, and resilient material (hereinafter sponge 107a, 107b) as shown in FIGS. 3a–3c. FIG. 3a is an isometric view of brush assembly 242 prior to insertion into sponge 107a, 107b. FIG. 3b is an isometric view of sponge 107a, 107b partially slipped around shafts 221, 223. FIG. 3c is an isometric view of sponge 107a, 107b mounted in operating position around brush assembly 242, such that the axis of sponge 107a, 107b is aligned parallel to the axes of shafts 221, 223 and does not overlap end blocks 244a, 244b, 246a, 246b.

Sponge 107a, 107b is typically formed of PVA (polyvinyl alcohol) and is supplied in a sealed bag after being pre-moistened e.g., with deionized water. During use sponge 107a, 107b is always kept moistened, typically but not necessarily with deionized water, to insure that sponge 107a, 107b has the proper surface moisture for cleaning wafers. Sponge 107a, 107b has a length L (see FIG. 3a) typically slightly over 8 inches for 8-inch diameter wafers and slightly over 12 inches for 12 inch diameter wafers. Length L may be specified in accordance with wafer diameters and shaft lengths.

In a preferred embodiment, sponges 107a, 107b consisting of PVA (polyvinyl alcohol) pre-moistened with deionized water are obtainable in sealed packages from Rippey Corporation in Dorado Hills, Calif., or from Merocel® Scientific Products, 950 Flanders Road, Mystic Conn. 06355. These sponges are designed particularly to be installed in a wafer cleaning brush 203a, 203b of the type shown in FIGS. 3a–3c.

Figure 4A:
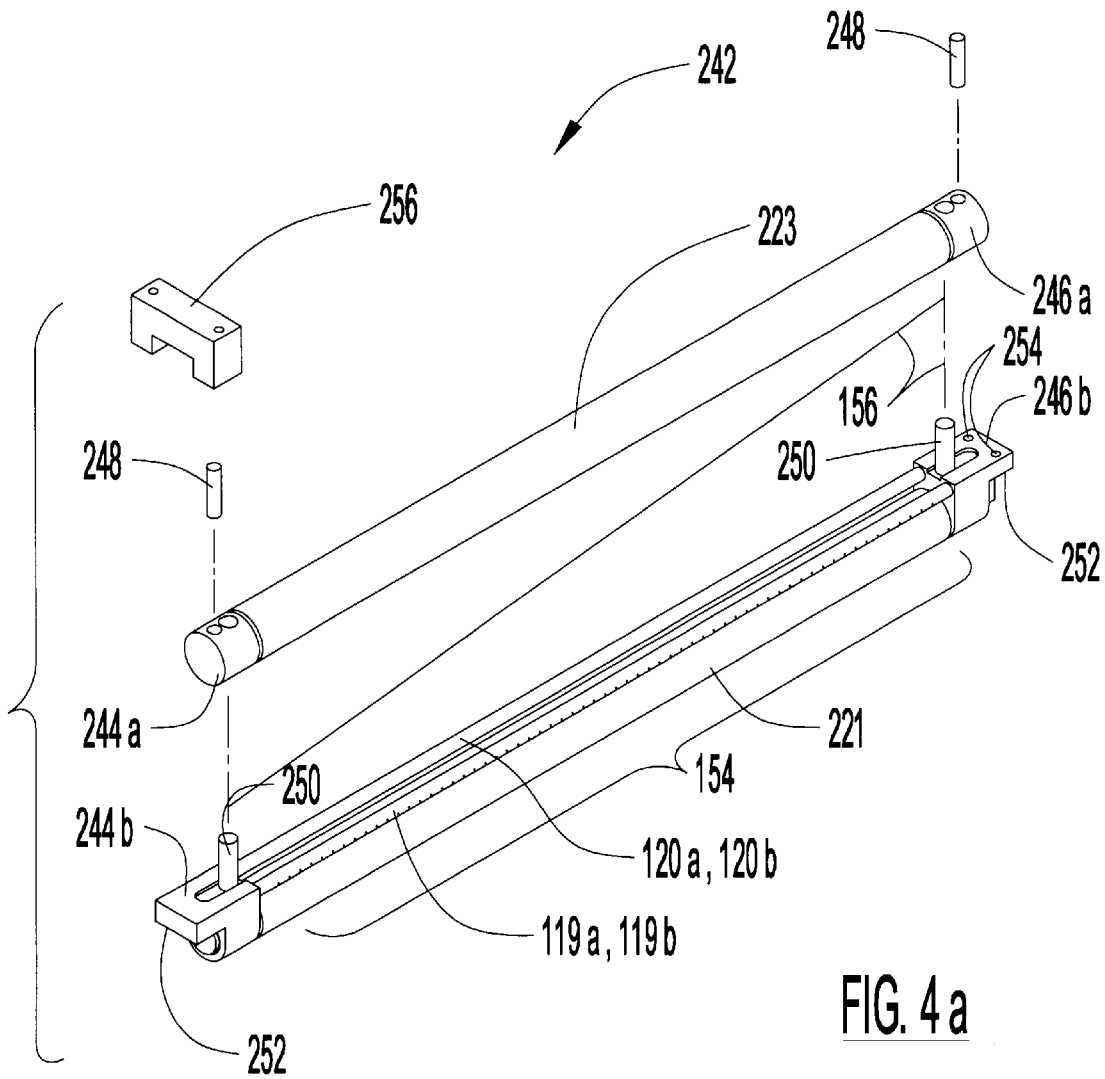
FIG. 4a is an exploded isometric view of a brush assembly.

FIG. 4a is an exploded isometric view of brush assembly 242. To facilitate the installation of sponge 107a, 107b onto shafts 221, 223 (see FIGS. 3a–3c), the distance between parallel shafts 221, 223 is made laterally adjustable by means of adjustment screws 248 and dowel pins 250. Adjustment screws 248 engage internal threads (not shown) in an upper end block 244a, 246a and bear against a lower end block 244b, 246b. Turning adjustment screws 248 in one direction with a conventional tool relieves the bearing force and allows shafts 221 and 223 to move laterally toward each other, allowing sponge 107a, 107b to be slipped easily onto brush assembly 242 without stretching (see FIG. 3b). When adjustment screws 248 are turned in an opposite direction, the bearing force is increased, expanding the distance between shafts 221 and 223, which move laterally outward relative to each other. This outward motion is limited by contact with the lumen of sponge 107a, 107b, which exerts an elastic constraining force opposing the bearing force. End blocks 244a, 246a are slidably guided by dowel pins 250, disposed one in each end block 244b, 246b, to assure that the axes of shafts 221 and 223 remain parallel with each other.

In an expanded condition, shafts 221 and 223 stretch sponge 107a, 107b into a substantially oval cross-sectional shape (see FIG. 3c). Sufficient traction is created between the contacting surfaces of sponge 107a, 107b and shaft 221, 223, causing sponge 107a, 107b to follow master shaft 221 and to drive slave shaft 223 rotationally without slippage.

Referring to FIG. 4a, rinse tubes 119a, 119b are installed in brush assemblies 242 along the length of shafts 221, 223, so that they lie in a space between shafts 221, 223 within the lumen of installed sponges 107a, 107b, respectively. Rinse tubes 119a, 119b are attached rigidly to end blocks 244b, 246b, and thus do not rotate with shafts 221, 223; therefore rotary fluid feedthroughs are not required. Rinse tubes 119a, 119b have fluid dispensing perforations 154 along their lengths. Perforations 154 are oriented to direct a spray outward from and substantially perpendicular to a midplane 156 containing axes of both shafts 221, 223 of brush assembly 242, and are slit-shaped with their major axes parallel to the axes of shafts 221, 223.

Also installed in brush assemblies 242 inserted within sponges 107a, 107b along the length of shafts 221, 223 are delivery tubes 120a, 120b. Delivery tubes 120a, 120b are attached rigidly to end blocks 244b, 246b, and thus do not rotate with shafts 221, 223; therefore rotary fluid feedthroughs are not required. Delivery tubes 120a, 120b have fluid dispensing perforations (not shown) along their lengths, similar to rinse tubes 119a, 119b. In the present embodiment the perforations of fluid delivery tubes 120a, 120b are directed outward and in a direction opposite from perforations 154 of rinse tubes 119a, 119b, and are likewise slit-shaped with their major axes parallel to the axes of shafts 221, 223.

Delivery tubes 120a, 120b and rinse tubes 119a, 119b may be substantially identical in structure, and may dispense either the same fluids or different fluids. Delivery tubes 120a, 120b and rinse tubes 119a, 119b are designed in accordance with conventional hydrodynamic principles, so that they maintain substantially uniform pressure throughout their respective lengths at their respective operating flow rates, and thus produce a longitudinally uniform spray pattern.

Delivery tubes 120a, 120b and rinse tubes 119a, 119b are connected at a first end to first end block 244b, which contains fluid feedthroughs (not shown) to connect rinse tubes 119a, 119b and delivery tubes 120a, 120b with pressurized fluid sources. Delivery tubes 120a, 120b and rinse tubes 119a, 119b are attached at a second end to second end block 246b, which may optionally contain fluid feedthroughs. End blocks 244a, 244b, 246a, 246b also contain bearings (not shown) for rotation of shafts 221, 223. Additionally, end blocks 244b, 246b each have a step 252 and optional mounting holes 254 to facilitate installing wafer cleaning brush 203a, 203b within brush station module 102, 104 (see FIG. 2) using appropriate fasteners (not shown). An alternative to mounting holes 254 is a compression collar 256, which straddles and clamps end blocks 244b, 246b within brush station module 102, 104.

Figure 4B:
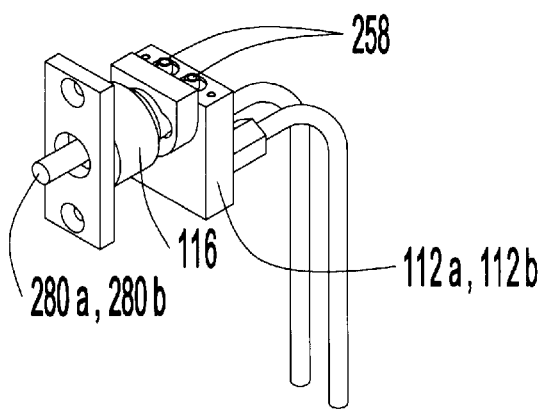
FIG. 4b is an isometric view of a first receive block.

To install wafer cleaning brush 203a, 203b within brush station module 102, 104 (see FIG. 2), first end block 244b is attached to a first receive block 112a, 112b located within brush station module 102, 104. FIG. 4b is an isometric view of first receive block 112a, 112b. First receive block 112a, 112b has fluid feedthroughs that connect with the fluid feedthroughs of first end block 244b via fluid coupling seals (e.g., compression o-rings 258) to deliver fluids to first end block 244b. Step 252 of first end block 244b (see FIG. 4a) positions first end block 244b longitudinally onto first receive block 112a, 112b, to align the openings of fluid feedthroughs in first end block 244b with the corresponding openings of fluid feedthroughs in first receive block 112a, 112b (not shown). Referring to FIG. 2, second end block 246b is similarly attached to a second receive block 114a, 114b located within brush station module 102, 104. In the present embodiment, fluid feedthroughs and coupling seals are not required in second end block 246b or second receive block 114a, 114b. End blocks 244b, 246b are fastened to receive blocks 112a, 112b, 114a, 114b using conventional means, e.g., mounting holes 254 or compression collar 256 with appropriate conventional fasteners.

Receive blocks 112a, 114a and 112b, 114b respectively are mounted on coaxial bearings 116 (see FIGS. 2, 4b) located in the process chamber walls of brush station module 102, 104. Labyrinth sealing of coaxial bearings 116 prevents fluids inside the process chamber from leaking to the outside of the process chamber. When installed into brush station module 102, 104, receive blocks 112a, 114a swivel around an axis 280a, with which master shaft 221 is aligned. The swivel motion brings sponge 107a into contact with wafer surface 160a for cleaning and retracts sponge 107a away from wafer surface 160a to provide sufficient access to load and unload wafer 160 between cleaning cycles. Similarly receive blocks 112b, 114b (not shown) swivel around an axis 280b, with which master shaft 221 is aligned. The swivel motion brings sponge 107b into contact with wafer surface 160b (not shown) for cleaning and retracts sponge 107b away from wafer surface 160b to provide sufficient access to load and unload wafer 160 between cleaning cycles.

Second receive blocks 114a, 114b each contain an additional shaft (not shown), concentric with swivel axes 280a, 280b, which transmits a rotational drive to master shafts 221. The connection between driven master shaft 221 and the external driving shaft is preferably made using a conventional tongue-and-groove mechanical coupling (not shown). This coupling method advantageously prevents backlash, minimizes corrosion and particle generation, and permits wafer cleaning brushes 203a, 203b to be installed and removed by sliding in one direction without disassembly of drive coupling or wafer cleaning brush, once the mounting fasteners are removed.

Figure 5:
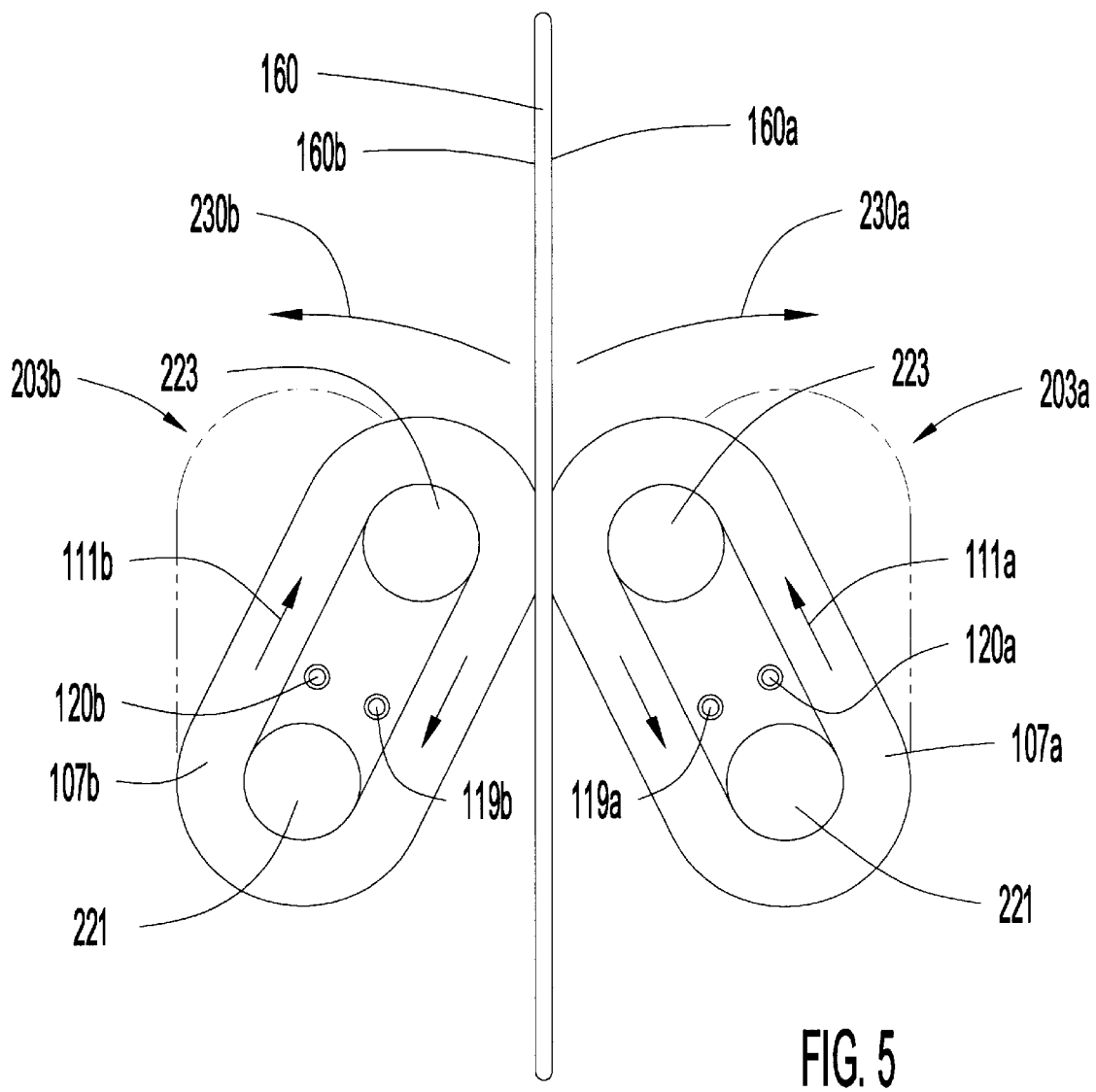
FIG. 5 is a cross-sectional view illustrating wafer cleaning brushes in operation to clean a wafer.

FIG. 5 is a cross-sectional view illustrating wafer cleaning brushes 203a, 203b in operation to clean wafer 160. During the cleaning cycle, wafer cleaning brushes 203a, 203b cause sponges 107a, 107b to rotate, thereby causing the surfaces of sponges 107a, 107b to rub against and remove contaminants from surfaces 160a, 160b of wafer 160. The line of contact between sponges 107a, 107b and wafer surfaces 160a, 160b, respectively, lies on the major horizontal diameter of wafer 160 to provide maximum cleaning coverage of wafer surfaces 160a, 160b. Wafer 160 is simultaneously oriented and rotated in a vertical plane by wafer drive apparatus 170 (see FIG. 2), thereby ensuring that all points on wafer surfaces 160a, 160b are subjected during the rotation cycle of wafer 160 to the scrubbing action of sponges 107a and 107b. Because of wafer rotation, the contact areas of sponges 107a, 107b may dwell for a longer time on some portions more than other portions of the surfaces of wafer 160. However, the cleaning cycle duration lasts long enough, so that any disparity in contact or dwell time does not adversely affect the overall cleanliness of the wafer.

The upper portions of wafer cleaning brushes 203a, 203b press symmetrically against wafer surfaces 160a, 160b respectively. Of importance, the symmetry of stress against the plane of wafer 160 reduces the risk of wafer breakage. Sponges 107a, 107b counterrotate, for example sponge 107b of wafer cleaning brush 203b rotates clockwise, whereas sponge 107a of wafer cleaning brush 203a rotates counterclockwise, as shown by arrows 111a and 111b, respectively. The senses of rotation illustrated in FIG. 5 are preferred to carry contaminants efficiently away from wafer surfaces 160a, 160b on the surfaces of sponges 107a and 107b and to discharge them downward into a bottom drain 152 of brush station module 102, 104 (see FIG. 2).

Rinse tubes 119a, 119b are interconnected through first receive block 112a, 112b with flexible supply tubes 109a, 109d respectively (see FIG. 2), which supply deionized water or other cleaning fluid to rinse tubes 119a, 119b. For example, deionized water may be supplied through flexible tube 109a and then directed through fluid feedthroughs in receive block 112a into rinse tube 119a, contained in wafer cleaning brush 203a (see FIG. 5). Rinse tube 119a has perforated side walls to allow fluid within rinse tube 119a to be ejected laterally and to contact and thus flush debris from sponge 107a. Likewise deionized water may enter flexible tube 109d and in turn be delivered through receive block tube 112b to rinse tube 119b contained in wafer cleaning brush 203b. Deionized water then is ejected laterally from rinse tube 119b through perforations along its length to contact and flush debris from sponge 107b.

Delivery tubes 120a and 120b are interconnected through first receive block 112a, 112b with flexible supply tubes 109b, 109c respectively, which supply an additional fluid to be sprayed onto the inner surfaces of sponges 107a, 107b. For example, delivery tubes 120a, 120b, which also have slit-shaped perforations along their length, dispense cleaning fluids or any other chemicals or appropriate fluids for use in the cleaning of wafers 160 against and into sponges 107a and 107b. The counterclockwise rotation of sponge 107a of wafer cleaning brush 203a and the clockwise rotation of sponge 107b of wafer cleaning brush 203b carry fluid ejected from delivery tubes 120a and 120b, respectively, into sponges 107a and 107b, which in turn directly contact wafer surfaces 160a and 160b, respectively, where the ejected fluids efficiently facilitate the process of cleaning wafer 160. Fluids delivered through delivery tubes 120a, 120b may include ammonia, ammonium hydroxide, dilute hydrofluoric acid (DHF), and any other appropriate cleaning solution or fluid.

Rinse tubes 119a, 119b dispense deionized water or other cleaner fluid onto the lower inside surfaces of sponges 107a, 107b. Between shafts 221 and 223, sponge 107a, 107b is in an expanded condition, thereby readily absorbent to fluid. In a typical configuration, a fluid from rinse tubes 119a, 119b (normally deionized water) flushes sponges 107a, 107b from the inside directly after they have contacted wafer surfaces 160a, 160b. This portion of sponges 107a, 107b is removed from wafer surfaces 160a, 160b, such that contaminant particles fall downward into the drain/exhaust area of the process chamber. As sponge 107a, 107b is rolled around master shaft 221, sponge 107a, 107b is progressively pressed radially by master shaft 221 to a more compressed condition, thereby squeezing out more contaminant carrying fluid. After passing around master shaft 221, sponges 107a, 107b reexpand, and a second fluid from delivery tubes 120a, 120b (e.g. dilute ammonia or a surfactant) premoistens sponges 107a, 107b directly prior to contact with wafer surfaces 160a, 160b. The repeated cycle of sponge expansion and compression facilitates flushing of contaminants from the surface of sponge 107a, 107b, and discharging of waste fluid and contaminants downward into bottom drain 152 (see FIG. 2).

The operation of rinse tubes 119a, 119b and delivery tubes 120a, 120b allows independent control of deionized water and cleaning fluids or of any two types of fluids. For example flow through rinse tubes 119a, 119b can be shut off, while fluids are delivered only through delivery tubes 120a, 120b if desired. Alternatively, the relative proportions of fluids through tubes 119a, 119b and 120a, 120b, respectively, can be varied.

One or more external fluid nozzles, for example nozzle assembly 272, are provided in each brush station module 102, 104. Nozzle assembly 272 may be programmed to dispense fluids, for example chemicals and DI water directly onto wafer surfaces 160a, 160b before, during, and after a cleaning operation.

Figure 6:
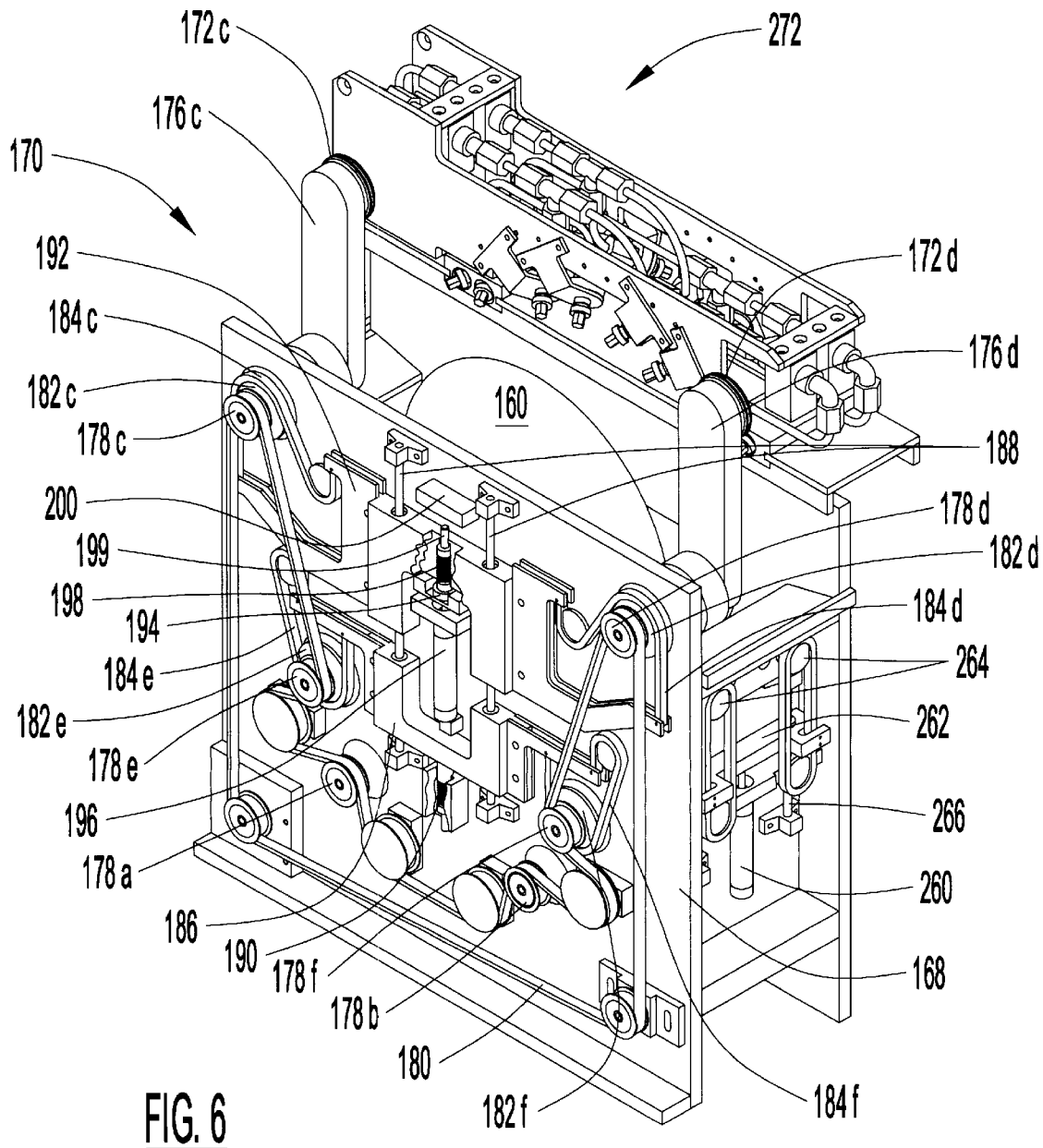
FIG. 6 is a cutaway isometric view showing portions of the brush swivel and wafer drive apparatus.

FIG. 6 is a cutaway isometric view showing portions of brush swivel apparatus. A low friction double acting air cylinder 260 may be interconnected to first receive blocks 112a, 112b through a brush linking plate 262 and swivel assemblies 264, to swivel wafer cleaning brushes 203a, 203b about the respective axes of master shafts 221. Since air cylinder 260 maintains a constant pressure independent of its rod extension, it can assure uniform contact pressure between sponge 107a, 107b and wafer surfaces 160a, 160b. Using a conventional belt-and-pulley or chain-and-sprocket drive arrangement, swivel assemblies 264 are symmetrically connected to brush linking plate 262, such that rotary motion is converted to linear motion. Brush linking plate 262 slides along vertical rails 266 and is attached to the piston rod of air cylinder 260. This type of linking configuration is described in greater detail in the discussion of wafer drive assembly 170 below. The symmetric linkage divides contact pressure evenly between wafer cleaning brushes 203a, 203b, and automatically compensates for wafer-to-wafer thickness variations. In addition it assures that both wafer surfaces 160a, 160b are contacted simultaneously and released simultaneously, reducing risk of breakage.

Figure 7:
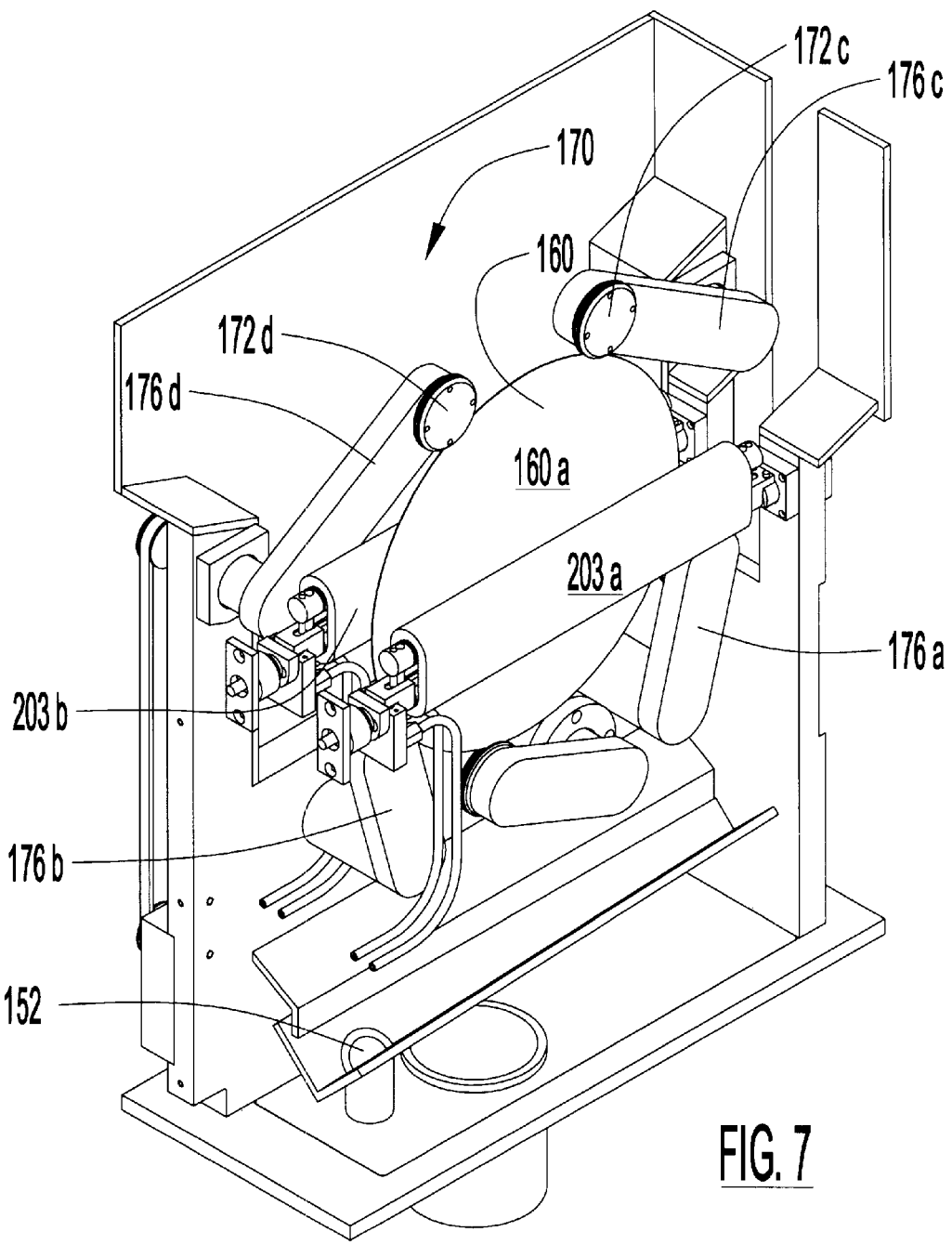
FIG. 7 is a cutaway isometric view of a brush station module showing wafer cleaning brushes swiveled into the retracted position away from the wafer surfaces.

In operation, during the loading of wafer 160 into wafer drive apparatus 170, wafer cleaning brushes are in the retracted orientation swiveled away to provide clearance to load wafer 160 into wafer drive apparatus 170. The piston rod of double acting air cylinder 260 is also retracted. At the beginning of a cleaning cycle the piston rod of double acting air cylinder 260 is extended, and the motion is coupled through brush linking plate 262 and swivel assemblies 264 to press wafer cleaning brushes 203a, 203b against wafer surfaces 160a, 160b (see FIG. 2). During a cleaning cycle double acting air cylinder 260 maintains pressure to hold wafer cleaning brushes 203a, 203b against wafer surfaces 160a, 160b. At the conclusion of a cleaning cycle the piston rod of air cylinder 260 (see FIG. 6) is retracted, forcing brush linking plate 262 to slide downward on vertical rails 266 and causing swivel assemblies 264 to swivel wafer cleaning brushes 203a, 203b away from wafer surfaces 160a, 160b (see FIG. 7 and direction arrows 230a, 230b of FIG. 5) into the retracted position, thereby providing sufficient clearance between wafer cleaning brushes 203a and 203b for wafer transport apparatus 108 (not shown, to be described in detail below) to remove wafer 160 from wafer drive apparatus 170 and to place another wafer into wafer drive apparatus 170. FIG. 7 is a cutaway isometric view of brush station module 102, 104 showing wafer cleaning brushes 203a, 203b swiveled into the retracted position away from wafer surfaces 160a, 160b.

The use of two adjustable parallel shafts 221 and 223 in brush assembly 242 is a feature that allows sponges 107a, 107b, in accordance with the embodiment, to be more uniform in surface texture during the cleaning operation and overcomes the prior difficulties associated with mounting a sponge over a single core or shaft. With shafts 221, 223 in the closest position to each other, brush assemblies 242 fit into the sponge lumen with little or no contact or friction, enabling a stress free sponge installation. It is possible to leave the sponge in its original packaging material (typically a plastic bag) during sponge installation, provided one end of the bag is open, reducing handling and particle contamination. The elimination of compressed and stretched areas in the longitudinal direction results in an even longitudinal distribution of sponge material along the shafts and thus improves the contact pressure uniformity between sponges 107a, 107b and wafer surfaces 160a, 160b. Uniform contact pressure in turn reduces stress on the wafer and the risk of wafer breakage. The adjustability of the distance between the two shafts allows controlling tension to achieve slippage-free sponge rotation.

During operation, the repeated sequence of compression and expansion of the sponge material around the perimeter reduces particle penetration into the soft sponge material. Incorporation of fluid delivery tubes within the lumen of hollow sponges 107a, 107b in the space between shafts 221, 223 facilitates flushing of contaminants and debris from wafer surfaces 160a, 160b and sponges 107a, 107b. Also rinsing and pre-wetting efficiency of the sponge material from internal fluid delivery tubes improves flushing and discharging of contaminants away from the wafer surfaces. With rinse tubes located within the lumen of the sponge, the flushing direction facilitates the desired particle flow. Continuous reconditioning (rinse) of sponges 107a, 107b leads to process consistency (each wafer processed under the same conditions), and extended sponge life between replacements. The embodiment requires no rotary fluid feedthroughs; therefore, mechanical simplicity and fluid cleanliness is maintained.

Brush assemblies 242 may be equipped or coupled with sensors (not shown) to measure in situ processing parameters, such as brush contact pressure.

Typical rotation speed of wafer cleaning sponges 107a, 107b lies in a range of from 200 RPM to 400 RPM. A safe maximum wafer rotation speed with tolerable breakage is roughly 200 RPM when wafer 160 is an 8 inch wafer. Under these conditions, a typical time to clean one wafer such as wafer 160 using the cleaning structure of this embodiment is approximately one minute including insertion and removal of the wafer. The manner in which the wafer is inserted into and removed from wafer drive apparatus 170 is described in greater detail below.

Horizontal wafer drive configurations are a very common, and in some process steps probably a preferred orientation (CVD, resist coat, develop, etch, polish, etc.). In cleaning applications, both horizontal and vertical wafer orientation are common. Single wafer processing equipment in most cases involves a horizontal wafer. In batch processing wafers are traditionally mounted vertically. A vertically oriented wafer occupies a significantly smaller footprint and is less vulnerable to recontamination, because its critical surfaces are parallel to the direction of gravity.

FIG. 8 is a cutaway isometric view of vertical wafer drive apparatus 170, in accordance with an embodiment of the invention. The purpose of wafer drive apparatus 170 is to rotate wafer 160 about its axis, with wafer surfaces 160a, 160b oriented vertically. A number of rolls 172a–172f are arranged coplanar and in contact with the circumference of wafer 160. A V-groove 174 around the circumference of each roll ensures radial and axial positioning of wafer 160, while it is rotated about its axis. Rolls 172a–172f are individually mounted on roll arm assemblies 176a–176f. During a cleaning operation, wafer 160 (see FIG. 2) must be rotated about a fixed axis to maintain contact alignment of wafer cleaning sponges 107a, 107b along the major horizontal diameter of wafer 160 and to avoid mechanical shock or damage to wafer 160 due to imbalance. Three rolls would theoretically be sufficient to capture and center wafer 160.

However, wafers commonly in production have notches or flats 162 at their circumferences (although notches or flats are not anticipated on the newer 300 mm diameter wafer size). In a three-roll configuration, when a flat 162 passes adjacent a roll 172a–172c, wafer 160 tends to lurch toward that roll, thereby displacing the rotation axis and inducing mechanical shock to wafer 160. This may be prevented by increasing the number of rolls above the theoretical minimum of three to assure centering of wafer 160 independent of the momentary position of a notch or flat 162. A wafer 160 with one flat 162, for example might require a minimum of four rolls 172a–172d to maintain at least three rolls in contact with wafer 160 at all times. Further, the distance between any two consecutive rolls must be greater than the length of a notch or flat 162, so that a notch or flat 162 passes only one roll 172a–172d at a given time. Additionally, a theoretical line connecting the two rolls adjacent any roll 172a–172d which is temporarily disengaged from wafer 160 at a passing notch or flat 162 must lie between the center of wafer 160 and disengaged roll 172a–172d, in order to keep the wafer centered. Therefore any two non-consecutive rolls separated by a single roll 172a–172d must be spaced more closely together than a wafer diameter. This is impossible to achieve for a complete set of four rolls simultaneously. Accordingly, to keep wafer 160 centered, more than four rolls are needed, provided wafer 160 has a notch or a flat.

In accordance with the present embodiment, to prevent rolls 172a–172f from following the contour of flat 162, rolls 172a–172f are linked together in pairs. A linked pair of rolls may follow wafer diameter variations only cooperatively but not individually. When flat 162 passes only one roll 172a–172f at any given time, a linked roll maintains the radial position of the pair. Such a configuration will then ensure that wafer 160 does not lurch in the direction of a roll 172a–172f adjacent a flat 162.

This configuration requires a minimum of six rolls 172a–172f for wafers having a notch or flat 162, since above described considerations dictate that there must be more than four rolls, and pairing dictates an even number of rolls. Further, in such a configuration at least one pair of rolls must be retractable for loading or unloading wafer 160 from the top or side. Two fixed rolls 172a, 172b are mounted on a pair of stationary arm assemblies 176a, 176b, and fix the rotation axis of wafer 160. Fixed rolls 172a, 172b are disposed symmetrically with respect to the vertical axis of wafer 160 and below the rotation axis of wafer 160, so that they do not interfere with wafer cleaning brushes 203a, 203b (see FIG. 7) or with the loading and unloading of wafer 160. Stationary arm assemblies 176a, 176b are adjustable to accommodate varying wafer diameters.

Two linked upper rolls 172c, 172d, mounted to upper swivelable arm assemblies 176c, 176d, preload wafer 160 against fixed rolls 172a, 172b. Two linked lower rolls 172e, 172f, mounted to lower swivelable arm assemblies 176e, 176f, stabilize the rotation axis of wafer 160 against temporary disengagement of fixed rolls 172a, 172b due to passing flats and notches 162. Linked upper rolls 172c, 172d and linked lower rolls 172e, 172f engage the circumference of wafer 160 under spring loading, which enables them to adapt automatically to variations in wafer diameter.

Within each arm assembly 176a–176f is a drive mechanism (not shown) consisting of pulleys and a belt transmitting the rotation of a shaft assembly, concentric with each swivel axis, to its respective roll. Concentric shaft assemblies 178a–178f and swivel mechanisms extend through bearings mounted on a structural wall 168 of brush station module 102, 104 (see FIG. 6). All six shaft assemblies are driven by a single drive belt 180 connected to a motor (not shown). Using a single belt results in closely synchronized roll speeds, minimizing slippage between rolls and wafer.

The amount of slippage is determined by contact pressure plus radial tolerances among the component rolls, shafts, and pulleys. The contact pressure between roll and wafer should be at least adequate for slip free motion but substantially below the wafer breakage level.

The swivel drive and radial stabilization of arm assemblies 176c–176f are achieved by converting rotary to linear motion using belts and pulleys (sprockets and chains are alternatives). The routing of the belts around the pulleys is such that one arm of each coupled pair swivels in clockwise direction and the other arm swivels counterclockwise, ensuring a symmetric arm configuration relative to the vertical axis of wafer 160.

As shown in FIG. 6, lower swivelable arms 176e, 176f are connected rigidly along their respective swivel axes through structural wall 168 to lower swivel pulleys 182e, 182f. Each lower swivel pulley 182e, 182f drives a lower swivel belt 184e, 184f respectively. Both ends of each lower swivel belt 184e, 184f are attached to a lower linking plate 186. Lower linking plate 186 in turn slides along vertical rails 188. An adjustable lower compression spring 190 supports the weight of lower linking plate 186. Lower compression spring 190 also provides the desired amount of preload (contact pressure) to linked lower rolls 172e, 172f. Lower compression spring 190 is adjusted for a particular wafer size by balancing the weight of lower linking plate 186 at an equilibrium position in which linked lower rolls 172e, 172f are located slightly closer to the center of wafer 160 than the actual wafer radius.

After wafer 160 is loaded, its weight and the preload of linked upper rolls 172c, 172d compensate for this positional offset. With a loaded wafer 160, linked lower rolls 172e, 172f contact the wafer edge with a pressure proportional to the setting of compression spring 190. If a flat or a notch 162 passes one of two linked lower rolls 172e, 172f, its position remains the same because the paired linked roll 172e, 172f retains contact with the wafer edge, thus maintaining the vertical position of lower linking plate 186 unchanged. The contact pressure between the engaged linked lower roll 172e, 172f and the wafer will be approximately doubled. Therefore the amount of set preload should never exceed half of the maximum permitted value.

The linkage of the two upper arm assemblies 176c, 176d is similar to that described above for linked lower arm assemblies 176e, 176f. Upper arm assemblies 176c, 176d need to swivel between two predetermined positions for a given wafer size. In the open position (arms vertical) a wafer can be loaded or unloaded. After a wafer is loaded, the arms close. Upper arm assemblies 176c, 176d are connected through structural wall 168 to upper swivel pulleys 182c, 182d, respectively. Each upper swivel pulley 182c, 182d is coupled through an upper swivel belt 184c, 184d, respectively, to an upper linking plate 192. Both ends of each upper swivel belt 184c, 184d are attached to upper linking plate 192. The routing of belts 184c, 184d around pulleys 182c, 182d is similar to that describing lower linking plate 186 above. Upper linking plate 192 slides along vertical rails 188 (optionally sharing the same rails with lower linking plate 186). A subplate 194 is captively coupled within a recess of upper linking plate 192 and is rigidly connected to the piston rod of a low friction double acting air cylinder 196.

When the piston rod of air cylinder 196 is extended, it forces attached subplate 194 upward against an upper compression spring 198, which in turn pushes upward against the recess of upper linking plate 192, causing attached upper swivel belts 184c, 184d to actuate upper swivel pulleys 182c, 182d and thereby causing upper arm assemblies 176c, 176d to close. Shortly before subplate 194 reaches its upper end position, upper rolls 172c, 172d touch the edge of wafer 160. Upper compression spring 198, which is adjustable by means of adjustment screw 199, is used to adjust the contact pressure of upper rolls 172c, 172d, against the circumference of wafer 160. When upper rolls 172c, 172d touch the wafer edge, upper link plate 192 stops traveling upward. The positional overrun of subplate 194 is converted into an adjustable preload. After subplate 194 reaches equilibrium with its load, piston rod of air cylinder 196 (rigidly attached to subplate 194) stops in an extended position. The degree of arm swivel to accept a different wafer size can be changed using a relocatable end stop 200, which limits the range of travel of upper linking plate 192. By driving two arm assemblies 176c, 176d with a common air cylinder 196 by way of upper linking plate 192, the two arm assemblies are caused to close symmetrically, minimizing the risk of mechanical shock or displacement of the wafer.

In case of a passing notch or flat 162 the same linking operation will occur as described above for lower arm assemblies 176e, 176f. When the piston rod of air cylinder 196 is retracted, subplate 194 moves downward first, releasing the preload. When the bottom surface of captive subplate 194 engages and pulls downward on upper link plate 192, upper arms 176c, 176d begin to swivel open.

To adapt to a different wafer size, lower arm assemblies 176e, 176f are repositioned without changing the preload. Upper arm assemblies 176c, 176d adapt to a new wafer size automatically, since the contact pressure is independent of rod extension.

In accordance with the embodiment, vertical wafer drive apparatus 170 allows easy brush access to both critical wafer surfaces 160a, 160b simultaneously. Different wafer sizes are readily accommodated by adjusting the positions of arm assemblies 176a–176f. Wafer drive apparatus 170 can smoothly rotate wafers with one notch or flat, without lateral displacement of the wafer rotation axis or potentially damaging mechanical shocks. Simultaneous drive of all rolls 172a–172f minimizes slippage, reducing mechanical stress and particle generation.

Figure 9A:
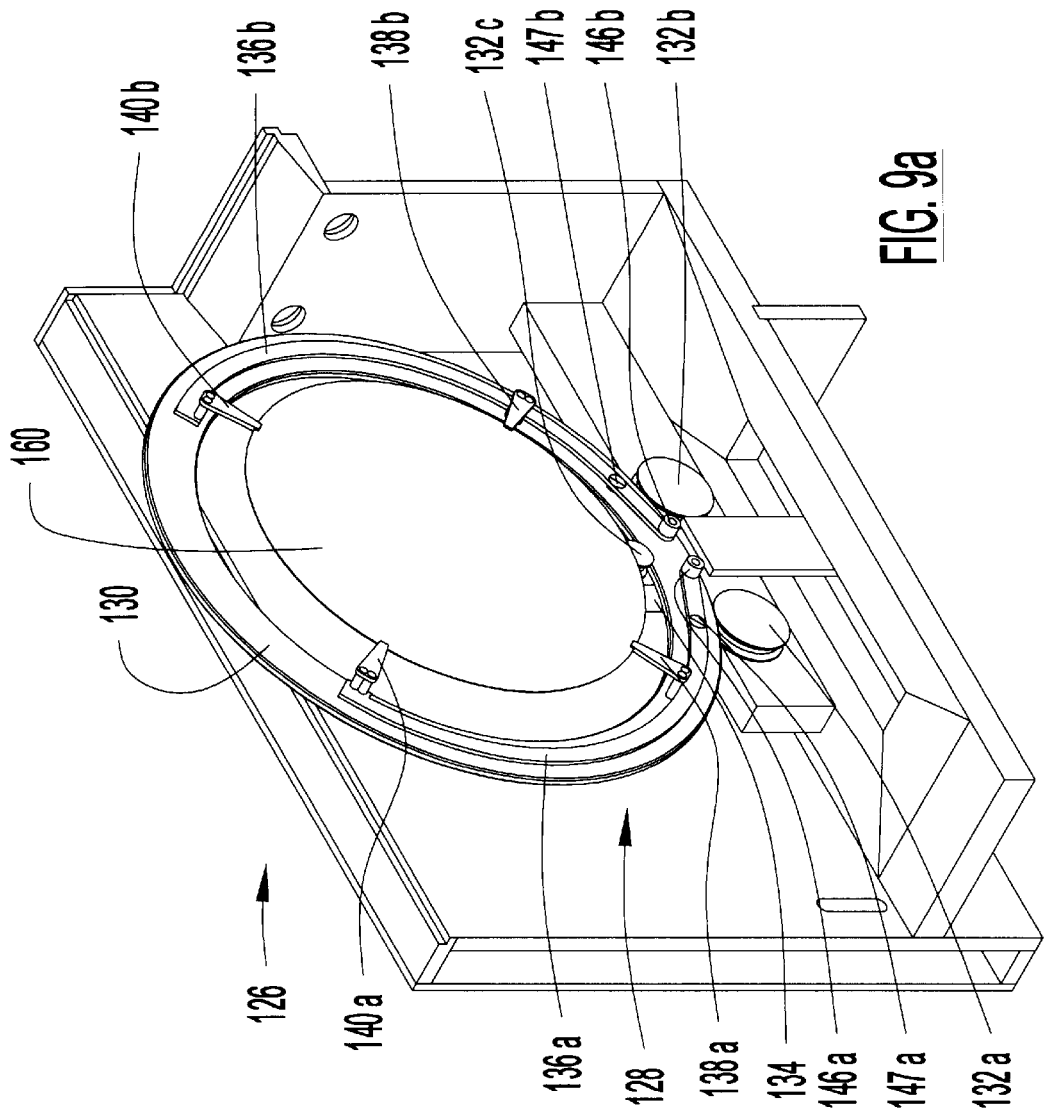
FIG. 9a is a cutaway isometric view of an alternative clamp ring embodiment of a wafer drive apparatus, shown in the operating configuration.

FIGS. 9a and 9b are cutaway isometric views of an alternative embodiment of wafer drive apparatus 126, in accordance with the invention. Referring to FIG. 9a, wafer drive apparatus 126 comprises a ring assembly 128, into which wafer 160 is rigidly clamped and rotated in a vertical plane. Ring assembly 128 comprises an annular ring 130 to which are attached two torsion spring preloaded levers 136a, 136b, having slotted clamps 140a, 140b, respectively, and contact pins 146a, 146b, respectively. Two fixed slotted clamps 138a, 138b are attached directly to annular ring 130. In one embodiment torsion spring preloaded levers 136a, 136b are pivotally attached to annular ring 130 on PTFE bushings (not shown) with shoulder screws 147a, 147b. Connected between torsion spring preloaded levers 136a, 136b respectively and annular ring 130 and encircling shoulder screws 147a, 147b respectively are preloaded helical torsion springs (not shown). The torsion springs apply a torque that rotates torsion spring preloaded levers 136a, 136b toward contact of slotted clamps 140a, 140b with the edge of wafer 160. Fixed slotted clamps 138a, 138b act as stops to prevent overrotation of torsion spring preloaded levers 136a, 136b, respectively.

In operation the edge of wafer 160 is held by slotted clamps 138a, 138b, 140a, 140b under light spring tension, such that wafer 160 is positioned substantially concentric with the axis of annular ring 130. Slotted clamps 138a, 138b, 140a, 140b are disposed with their respective slots in a plane parallel with but offset from annular ring 130, to provide access for cleaning and handling wafer 160, and are disposed about the circumference of annular ring 130 in a configuration to prevent movement of wafer 160 relative to slotted clamps 138a, 138b, 140a, 140b and to facilitate wafer loading and unloading. Slotted clamp parts are kept thin to minimize interference with wafer cleaning brushes 203a, 203b. The inner diameter of annular ring 130 is made large enough to provide adequate clearance for wafer cleaning brush 203a, 203b during the cleaning operation. The preload of preloaded levers 136a, 136b, is set at a value high enough to keep levers 136a, 136b from opening under centrifugal force during rotation of ring assembly 128 and low enough to avoid wafer breakage from mechanical stress.

Ring assembly 128 rotates about the central axis of annular ring 130, supported by two grooved rolls 132a, 132b contacting an outer circumference and one grooved roll 132c contacting an inner circumference of annular ring 130. Grooved rolls 132a, 132b, 132c are oriented such that their respective grooves lie in the same vertical plane as that of annular ring 130. One grooved roll, e.g. grooved roll 132a, is driven using a belt-and-pulley arrangement or other conventional means; the remaining two grooved rolls, e.g. grooved rolls 132b, 132c, rotate freely on their respective shafts. Particularly, the shaft of grooved roll 132c is mounted into an adjustably preloaded arm 134, allowing control of contact pressure between annular ring 130 and three grooved rolls 132a–132c. Using only one drive roll ensures slip free rotation and therefore no particle generation. Preloaded arm 134 carrying grooved roll 132c can be swiveled, thereby providing access to remove or exchange entire ring assembly 128. Interchangeability of ring assemblies supports multiple wafer size processing capability. Not only round wafers, but square, rectangular, etc. shaped substrates can be processed. Each ring assembly may be configured for a distinct substrate size and shape. Typically grooved rolls 132a, 132b may remain in their respective positions during interchange of ring assemblies.

FIG. 9b is a cutaway isometric view of wafer drive apparatus 126 as configured for wafer loading and unloading. For wafer loading or unloading, rotation of ring assembly 128 is first stopped in a home orientation, i.e. with contact pins 146a, 146b in their lowest position. An air cylinder (not shown) extends a release bar 142 through a slot 144 in the bottom panel 148 of wafer drive apparatus 126 disposed substantially parallel with the plane of annular ring 130. Release bar 142 pushes against contact pins 146a, 146b, causing torsion spring preloaded levers 136a, 136b to pivot, thereby slidably withdrawing slotted clamps 140a, 140b from the edge of wafer 160. Slotted clamps 140a, 140b and preloaded levers 136a, 136b are pivoted away from wafer 160, allowing sufficient clearance to slide wafer 160 out of lower fixed slotted clamps 138a, 138b, thereby unloading wafer 160.

To load a wafer 160, the wafer edge is first inserted into lower fixed slotted clamps 138a, 138b. The air cylinder is depressurized, gradually withdrawing release bar 142 and thereby releasing pressure from contact pins 146a, 146b. Preloaded levers 136a, 136b then return under spring tension to their respective preset operating positions (see FIG. 9a) with upper slotted clamps 140a, 140b slidably engaging the circumference of wafer 160.

In accordance with the alternative embodiment, wafer drive apparatus 126 provides true slip free rotation by using one driver roll only. It easily accommodates multiple wafer sizes including substrates with shapes other than round, facilitating flexible manufacturing. It comprises fewer rotating parts than other embodiments, leading to a simplified drive mechanism and less particle generation. It requires no relative motion between wafer and clamps during operation with potentially reduced abrasion and risk of wafer breakage.

Figure 10C:
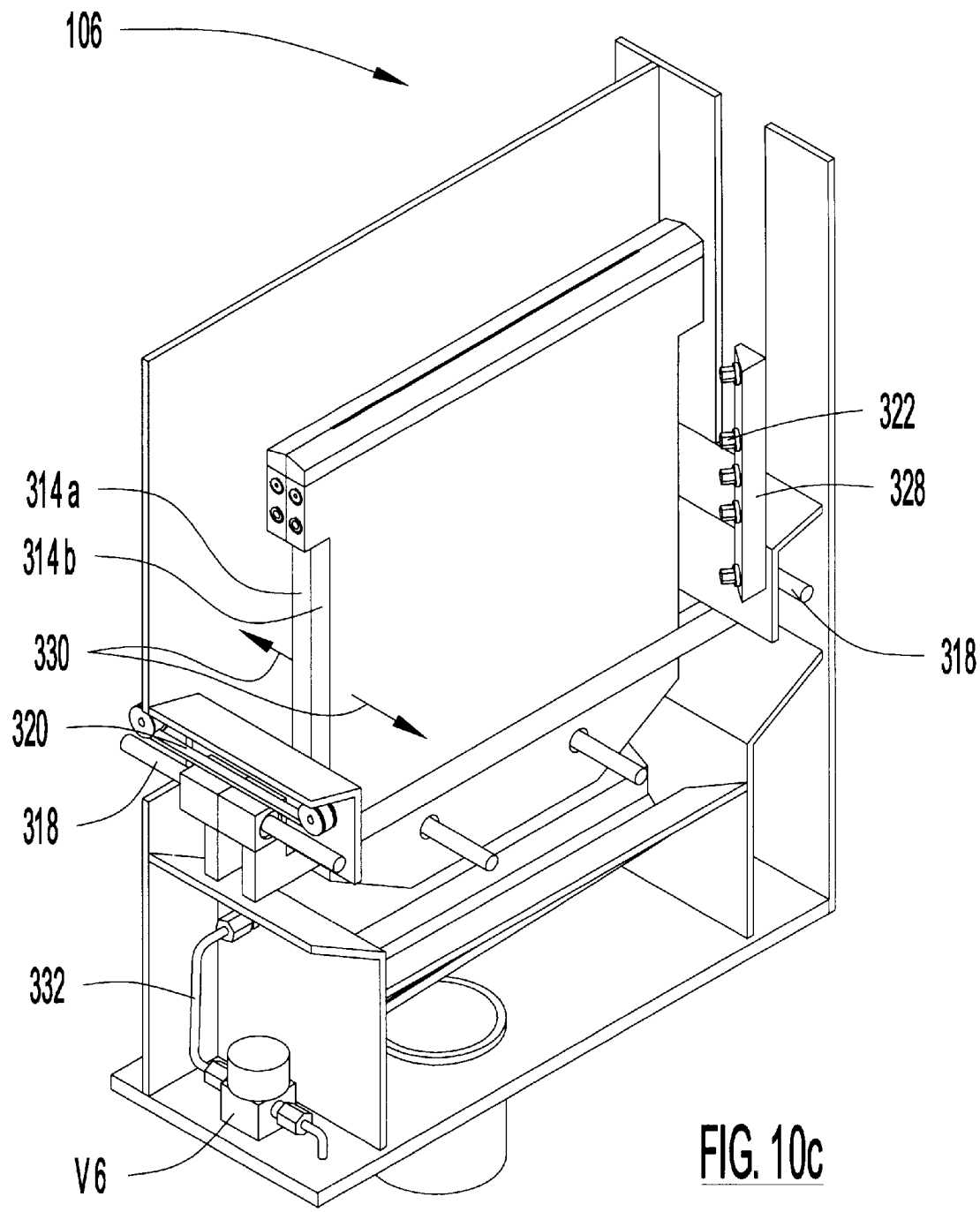
FIG. 10c is a cutaway isometric view of a rinse/dry station module in accordance with an embodiment of the invention, shown with containment chambers in the closed position.

FIGS. 10a–10c are cutaway isometric views of various assemblies of rinse/dry station module 106, in accordance with an embodiment of the invention. Rinse/dry station module 106 employs the "MARANGONI" method, familiar in the art, wherein a dynamically changed surface tension mechanism promotes drying a wafer without spinning. Generally a small amount of isopropyl alcohol (IPA) is evaporated with nitrogen gas and applied onto a wet wafer surface.

Combined rinse/dry station module 106 contains a stationary receive frame 310 in which wafer 160 is held during the rinse and dry cycles. Receive frame 310 incorporates a minimum of three slotted arms 312a–312c, which support wafer 160 in a stationary vertical position. Two containment chambers 314a, 314b are movably mounted, each facing an opposite surface of wafer 160. O-rings 342 and a gasket 344 seal containment chambers 314a, 314b against each other when closed, forming a sealed container.

For clarity containment chamber 314b is shown shaded in FIG. 10a. At least one containment chamber 314a, 314b has a recess 316 in an inner surface facing wafer 160, with a distance, typically of the order of 12 millimeters or less and preferably on the order of 6 millimeters wall-to-wall between inner walls containment chambers 314a, 314b when closed, to accommodate wafer 160. Illustratively, common guide rails 318 and a shared drive mechanism 320 (see FIG. 10c) translate containment chambers 314a, 314b toward or away from each other (closed/open), in accordance with direction arrows 330.

Referring to FIG. 10a, in an open position (chambers 314a, 314b most distant from each other) wafer 160 and inner walls of chambers 314a, 314b including recess 316 arc exposed to a DI (deionized) water rinse from one or more rinse nozzles 322 mounted adjacent containment chamber 314a. Rinse nozzles 322 are supplied with DI water through a valve V5 and a rinse nozzle assembly 328, which may be assembled from conventional tubing and fittings. Not shown for clarity is a second rinse nozzle assembly mounted adjacent containment chamber 314b. Containment chamber 314a is also connected to a source of DI water through a valve V4 and a supply tube 346 connected to an inlet port near the top of containment chamber 314a. An outlet port at the bottom of containment chamber 314a is connected through a tube 332 and an outlet metering valve assembly V6 to a drain. An IPA vapor source (see FIG. 10b) is connected through a fitting 348 in fluid communication with a narrow slot 326 extending horizontally above the full width of recess 316. Rinse nozzle assembly 328 is protected by a cover 350, shown shaded in FIG. 10a.

FIG. 10b is a cutaway isometric view of an IPA vapor source assembly 334, which is connected by conventional tubing to containment chamber 314a at fitting 348. IPA vapor source assembly 334 includes an IPA reservoir 324, which is connected via a refill tube 336 and a valve V2 to a remote refill supply of liquid IPA. A submerged tube 338 with small perforations (not shown) in IPA reservoir 324 is connected to a remote source of nitrogen or other suitable carrier gas through gas tube 340 and valve V1. Optional liquid level sensors are positioned in IPA reservoir 324. The outlet for IPA vapor from IPA reservoir 324 is connected to the low pressure inlet port of an aspirator 352. The outlet port of aspirator 352 is connected to containment chamber 314a (see FIG. 10a) through outlet fitting 354 and conventional tubing. The high pressure inlet port of aspirator 352 is connected to valve V3, which may be alternately toggled through a gas supply tube 356 to a remote source of nitrogen (not shown) or through an exhaust tube 358 to an exhaust port (not shown).

FIG. 10c is a cutaway isometric view of rinse/dry station module 106 with containment chambers 314a, 314b in the closed position. Containment chambers 314a, 314b are slidably attached to guide rails 318 and are translated into open and closed positions by shared drive mechanism 320 as indicated by directional arrows 330. Rinse nozzles 322 connected to rinse nozzle assembly 328 are located outside but adjacent to containment chambers 314a, 314b. An outlet port at the bottom of containment chamber 314a is connected through a tube 332 and an outlet metering valve assembly V6 to a drain. Illustratively, rinse nozzle assembly 328, tube 332, and outlet metering valve assembly V6 are located differently in FIG. 10a and FIG. 10c.

In operation containment chambers 314a, 314b are in the open position, while wafers 160 are being transported or in a standby status. Inner surfaces including recess 316 of containment chambers 314a, 314b are rinsed for a predetermined time by rinse nozzles 322, after which valve V5 is shut off and wafer 160 is placed in receive frame 310. Then valve V5 is turned on again to rinse wafer 160 and containment chambers 314a, 314b, and after a predetermined time is again shut off. Alternatively valve V5 may remain open during wafer placement. The containment chambers 314a, 314b move to the closed and sealed position. Valve V4 is then turned on, allowing containment chambers 314a, 314b to fill with DI water. Concurrently valve V1 is turned on, admitting nitrogen or other suitable gas into IPA reservoir 324. The nitrogen bubbles released into the liquid IPA promote evaporation of IPA and concurrently create a pressurized atmosphere within IPA reservoir 324. After wafer 160 is completely submerged in DI water, valve V4 is shut off. Valve V3 is now switched from exhaust to nitrogen supply, producing a Venturi effect in aspirator 352 that pulls IPA vapor with carrier gas from IPA reservoir 324 and delivers it through fittings 354 and 348 into slot 326 of containment chamber 314a.

Outlet metering valve assembly V6 is now opened allowing the DI water to drain from containment chambers 314a, 314b at a controlled rate. The DI water is displaced uniformly by IPA vapor delivered through slot 326, uniformly drying wafer 160. After the DI water has drained completely and wafer 160 is dry, valve V3 is toggled to the exhaust position to prevent vapors from escaping from containment chambers 314a, 314b, when they return to the open position. Containment chambers 314a, 314b then open, and concurrently outlet metering valve assembly V6 closes. Dry wafer 160 is removed from receive frame 310, and as soon as it has cleared rinse/dry station module 106, the cycle begins again with rinsing of inner surfaces of containment chambers 314a, 314b by rinse nozzles 322.

Advantageously, the present embodiment enables minimal single wafer process time and minimal IPA and DI water consumption due to the small volume of containment chambers 314a, 314b. Inner surfaces of containment chambers 314a, 314b are rinsed with DI water by rinse nozzles 322, starting as soon as dry wafer 160 is clear of rinse/dry station module 106 and continuing simultaneously with loading of the next wafer 160 and until inner surfaces of containment chambers 314a, 314b are flushed free of contaminants and particles before moving into close proximity with wafer 160. The rate of water level drop is controlled and varied by setting the nitrogen gas pressure at the high pressure inlet port of aspirator 352 and outlet metering valve V6. IPA vapor may be separated from other drain discharge by valve V6 or via a recovery system of conventional design beyond valve V6 (not shown).

Different size wafers may be accommodated by replacing the receive frame. To reduce the volume between the two containment chambers for a smaller wafer, inserts or custom containment chambers may be used. Water consumption may then remain substantially proportional to wafer size.

An alternative embodiment allows only a single IPA reservoir to supply multiple rinse/dry station modules 106. A valve between remote IPA reservoir and containment chambers 314a, 314b may control the amount of IPA vapor dispensed. To minimize consumption, this valve is positioned as close as possible to containment chambers 314a, 314b, which are then filled with vapor only as needed.

In a further alternative approach, IPA vapor is generated by means of an atomizing nozzle mounted in single or multiple IPA reservoirs. The fluid port of the atomizing nozzle is connected to the IPA refill source, and the atomizing gas port is connected to a source of nitrogen or other suitable inert carrier gas. In accordance with this alternative approach, small droplets of IPA are sprayed into the IPA reservoir, where they evaporate and mix with nitrogen carrier gas. The IPA/nitrogen mixture then flows to containment chambers 314a, 314b in the same fashion as described in the previous approach.

Numerous wafer transport system designs are familiar in the art. The wafer transport apparatus described herein is configured to the specific needs of overall wafer cleaning and drying apparatus 100, in accordance with the present invention.

Figure 11A:
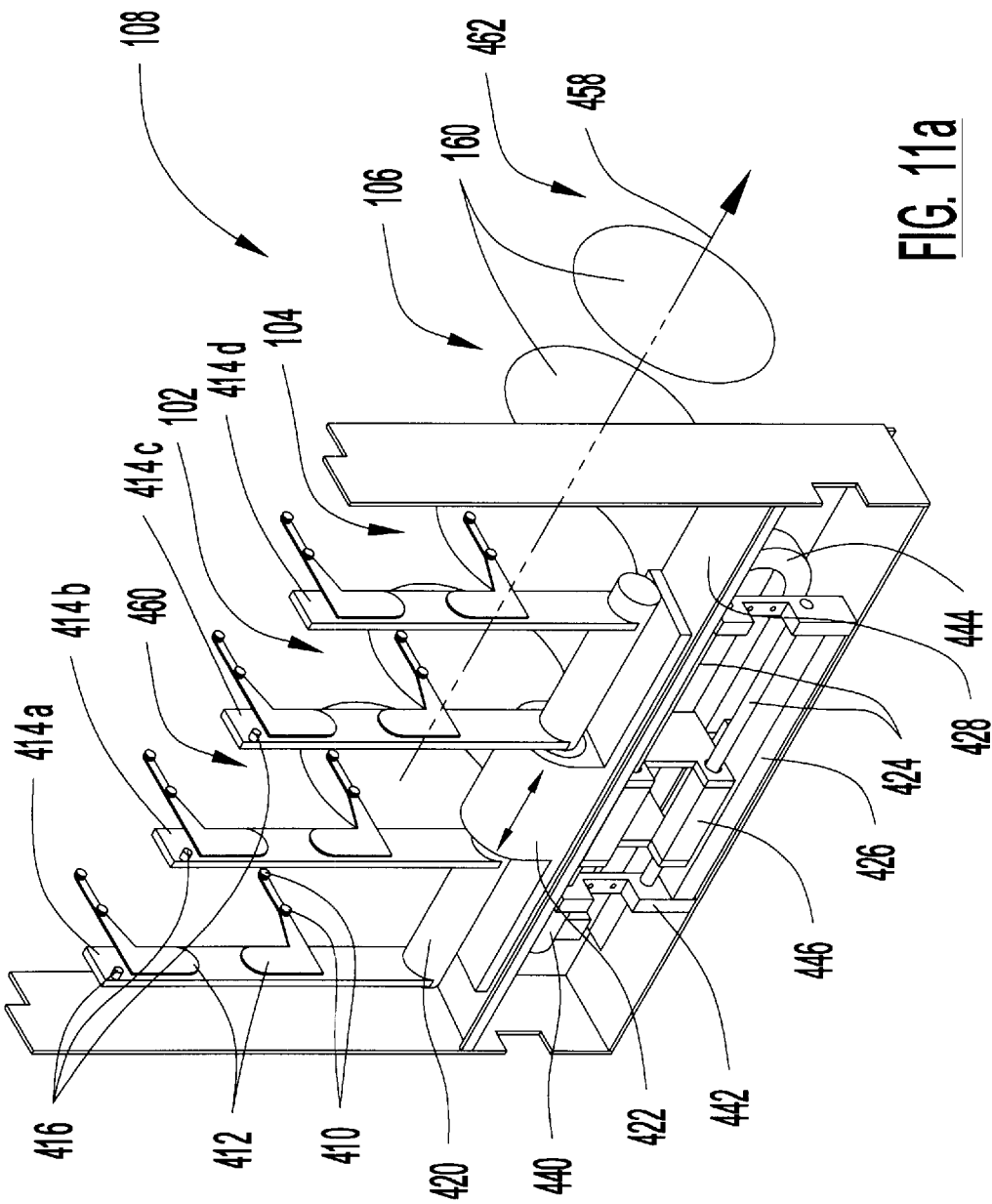
FIG. 11a is a cutaway isometric view of a wafer transport apparatus, in accordance with an embodiment of the invention.

FIG. 11a is a cutaway isometric view of wafer transport apparatus 108, in accordance with an embodiment of the invention. Wafer transport apparatus 108 moves wafers 160 between first brush station module 102, second brush station module 104, and rinse/dry station module 106, collectively hereinafter process modules 102, 104, 106. Wafer transport apparatus 108 transfers wafers 160 in sequence from one process module 102, 104, 106 to the next (module locations are indicated by wafers only for clarity).

Illustratively, wafer cleaning and drying apparatus 100 is configured with process modules 102, 104, 106 equally spaced in sequence of operation and aligned so that wafers 160 contained and fully engaged therein have their respective surfaces in parallel planes and their respective centerlines along a common axis, hereinafter module axis 458. Additional transfer modules, hereinafter receive module 460 and send module 462, are positioned and aligned at the beginning and end, respectively of the sequence of process modules 102, 104, 106. Receive module 460 receives wafer 160 from a previous operation and send module 462 sends wafer 160 to a subsequent operation after the wafer cleaning and drying processes of wafer cleaning and drying apparatus 100.

A substantially cylindrical spacing bar 420 is rotationally mounted in a transport housing 422 with its longitudinal axis parallel to module axis 458. Rotation of spacing bar 420 in transport housing 422 is actuated by a belt and pulley assembly (not shown) driven by a stepper motor 440 attached to transport housing 422 or by other conventional means.

Illustratively, four lever assemblies 414a–414d are each attached by one end radially to spacing bar 420 at equal rotational orientation and with substantially equal longitudinal spacing. Generally the number of lever assemblies 414a–414d attached to spacing bar 420 is one fewer than the total number of process and transfer modules. Lever assemblies 414a–414d are individually adjustable on spacing bar 420 both longitudinally and rotationally, as detailed below. Paired end effectors 412 with four attached grooved cylinders 410 are swivelably mounted onto a portion of each lever assembly 414a–414d distal to spacing bar 420.

Figure 12:
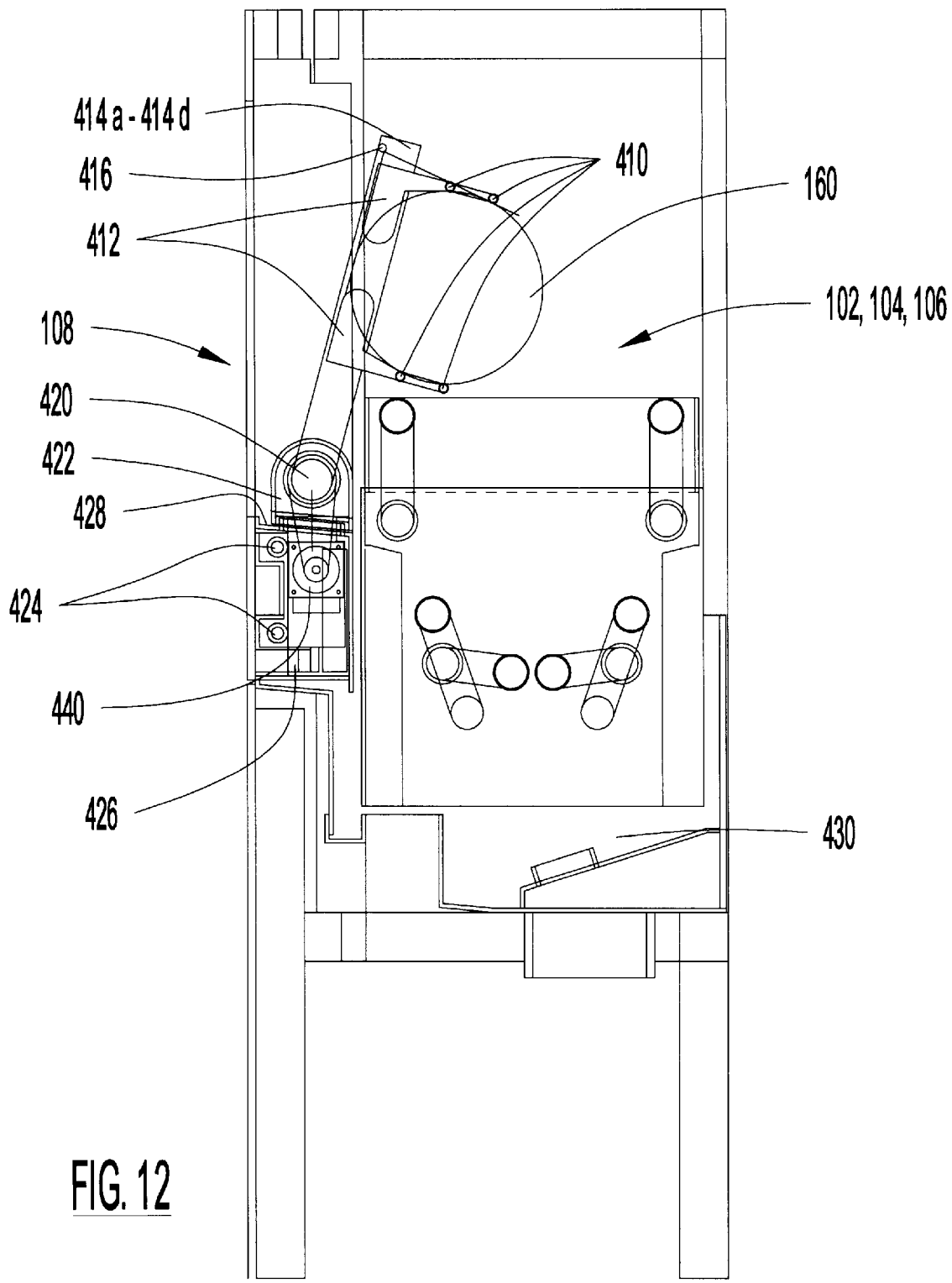
FIG. 12 is a cross-sectional view of the wafer transport apparatus of FIG. 11 a at a typical process module, during one stage of the wafer transport cycle.
Figure 13:
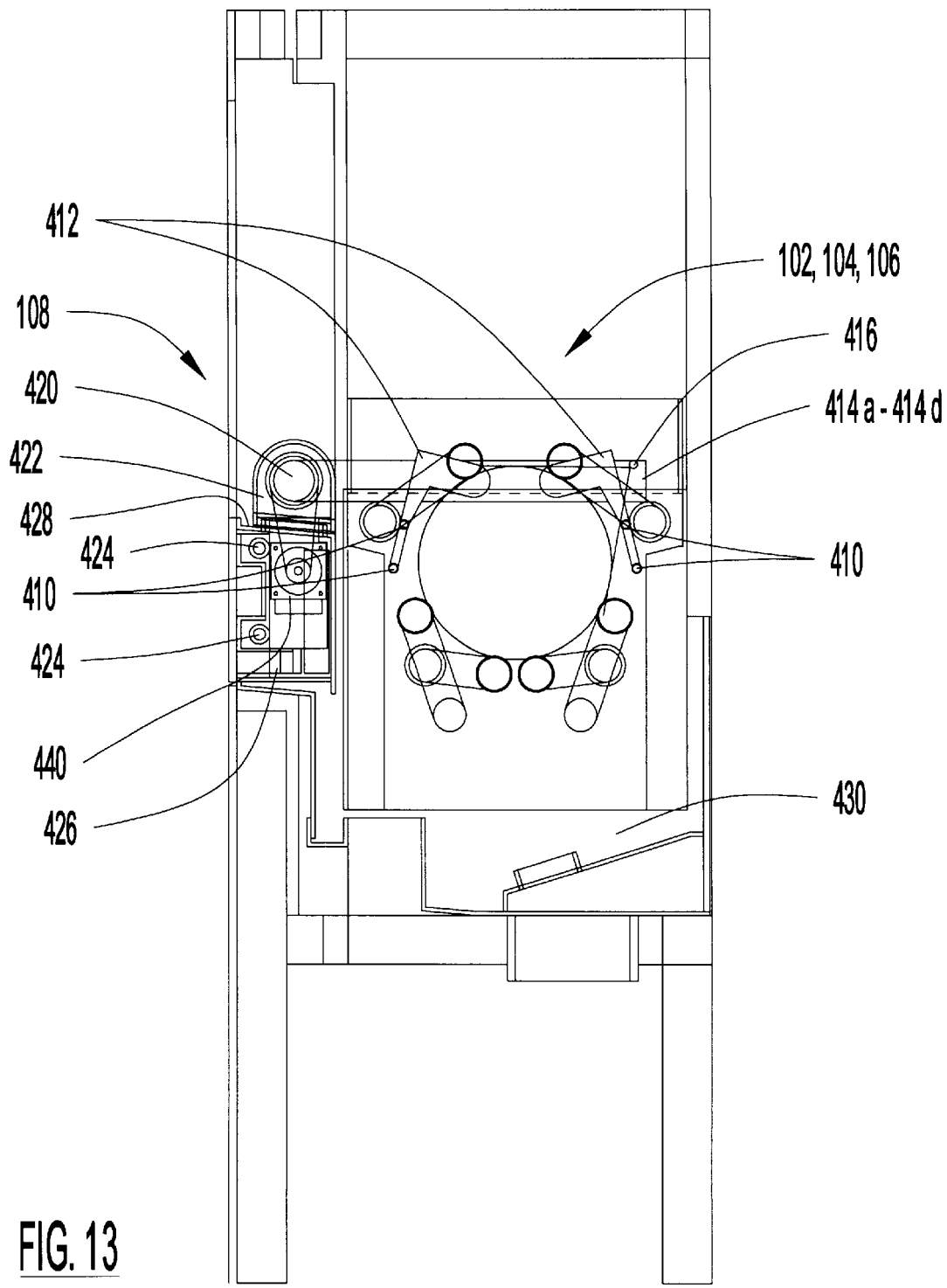
FIG. 13 is a cross-sectional view of the wafer transport apparatus of FIGS. 11, 12 at a typical process module, during a different stage of the wafer transport cycle.

FIGS. 12, 13 are cross-sectional views of wafer transport apparatus 108 at a typical process module 102, 104, 106 during different stages of the wafer transport cycle. Referring to FIG. 12, wafers 160 are gripped vertically at their edges by four grooved cylinders 410. A wafer edge is gripped by the grooves so that wafer 160 is fixed in both radial and longitudinal position relative to end effectors 412 during wafer transfer.

Consecutive grooved cylinders 410 are positioned on an end effector 412 symmetrically relative to the centerline of wafer 160, such that the distance between consecutive grooved cylinders 410 is greater than the length of a flat on the wafer. Alternatively, if wafer 160 has one or more flats or notches, or is of a different size, the configuration of end effectors 412 and grooved cylinders 410 may be modified accordingly to meet a specific requirement. Illustratively, for wafers 160 having one or more flats or notches, grooved cylinders may be replaced by conventional elastically deformable edge gripping arms, as described for example in Kudo et al. U.S. Pat. No. 5,547,515, provided that the length of a gripping surface is greater than the length of a notch or flat. End effectors 412 may be removed, replaced, and interchanged on lever assemblies 414a–414d using conventional means such as threaded fasteners.

Spacing bar 420 with attached lever assemblies 414a–414d is rotatable in transport housing 422 typically by 90 degrees, thereby causing distally mounted end effectors 412 with attached grooved cylinders 410 to pick and place wafers 160 at process modules 102, 104, 106. End effectors 412 are mounted to lever assembly 414a–414d symmetrically relative to the centerline of wafer 160 when rotated into a process chamber (not shown for clarity). End effectors 412 have an open and a closed position. In the closed or "normal" position, shown in FIG. 12, end effectors 412 clamp wafer 160 into grooved cylinders 410. In the open position, shown in FIG. 13, end effectors cause grooved cylinders 410 to release wafer 160.

FIG. 11b is a cutaway isometric view of the detailed structure of lever assembly 414a–414d and spacing bar 420 as shown in FIG. 11a above. Lever assembly 414a–414d comprises an arm 372, a cover 374 (shown in broken lines for clarity), and a mounting/alignment block (hereinafter block 376), which interconnects lever assembly 414a–414d with spacing bar 420. The elements of the swivel mechanism for end effectors 412 mount onto arm 372. Mounting holes, bores for bearing installation, and recesses for actuators and supply tubing (not shown) are provided in arm 372. Cover 374 slides over arm 372 and attached mechanisms from the free end of arm 372 toward block 376, sealing and protecting the enclosed components from fluids and debris. An O-ring 378 forms a seal between arm 372 and cover 374. Lateral openings are provided in the cover for the swivel shafts of end-effectors 412. Labyrinth type seal assemblies (not shown) are installed around the swivel shafts of end-effectors 412 between the outside of cover 374 and end effectors 412 to secure cover 374 in place, to prevent outside fluids from entering lever assembly 414a–414d, and to prevent possible contaminants within lever assembly 414a–414d from emerging.

Block 376 interconnects lever assembly 414a–414d to two mounting bars 380, which are internal to and extend parallel to one another substantially the full length of spacing bar 420. Block 376 contains clearance slots 402 that slide over mounting bars 380 and a flat section 382 that fits between mounting bars 380. Bar mounting screws 386 secure block 376 through oversize clearance holes to mounting bars 380. A flange section 384 of block 376 is secured to arm 372 through oversize curved clearance slots in flange section 384 by arm mounting screws 388. Set screws 390 engaging flange section 384 bear against the flat surface of arm 372 in opposition to arm mounting screws 388, to adjust the longitudinal and angular alignment between block 376 and arm 372. Set screws 390 cooperatively with oversize mounting holes and slots allow adjustment of lever assemblies 414a–414d individually with respect to the longitudinal axis of spacing bar 420 in all six translational and rotational degrees of freedom. Thus block 376 serves as a universal adjustment structure for aligning lever assembly 414a–414d with process modules 102, 104, 106.

To protect mounting bars 380, block 376, supply lines 392 as well as other utilities and mechanisms (not shown), a retractable cover 394 is installed around spacing bar 420. Retractable cover 394 comprises two cover cups 396 connected by a flexible bellows 398. The faces of cover cups 396 have O-ring grooves 400 with O-rings (not shown) to seal against the flat surface of arm 372. Bellows 398 contracts to allow access to block 376 and flexes to accommodate alignment settings of lever assembly 414a–414d. The ends of spacing bar 420 are sealed with caps 404 attached to the outside flat surfaces of arms 372 of end lever assemblies 414a, 414d.

The swivel mechanism for end effectors 412 is actuated by a pneumatic cylinder 472. Preferred is a conventional single-acting, spring extended cylinder. The cylinder rod is attached to a belt clamping block 474, which holds one end of a double sided open-ended timing belt (hereinafter timing belt 476). The other end of timing belt 476 is attached to a coil spring 478 to maintain tension. The spring load and the mounting position of extended pneumatic cylinder 472 define the amount of preload transmitted to end effectors 412 in their closed position. Timing belt 476 is threaded around two pulleys 480 connected to the swivel shafts of end effectors 412, which translate the linear motion of timing belt 476 into swivel motion of the end effectors 412. Position sensors 482, preferably employing inductive means, verify the actual end effector orientations by detecting the positions of pins 484 installed in pulleys 480.

The end effector orientation having the lowest spring tension is the closed orientation shown in FIG. 11b. In operation, when pneumatic cylinder 472 is pressurized, timing belt 476 is pulled toward pneumatic cylinder 472, and end effectors 412 swivel open. A lock lever 486 is preloaded against belt clamping block 474 by a torsion spring (not shown). When belt clamping block 474 reaches the limit of its travel toward pneumatic cylinder 472, it releases lock lever 486, which snaps upward, blocking the return path of belt clamping block 474. End effectors 412 are now in the open orientation and are prevented from closing unless lock lever 486 is removed. In normal operation a pin cylinder 488 attached to a mounting block 490 and pressurized through a pneumatic supply line 492 pushes against lock lever 486, causing lock lever 486 to rotate clear of belt clamping block 474. Pneumatic cylinder 472 is then depressurized through a flow control valve (not shown), allowing smooth and gradual closing of end effectors 412.

If a power failure, pressure loss, or emergency shutdown occurs when end effectors 412 are in the open orientation, then lock lever 486 ensures that they remain in the open orientation and out of contact with wafers 160. If such a loss occurs when end effectors 412 are closed or in motion, however, end effectors 412 smoothly and gradually close as in normal operation.

A rinse nozzle 416 mounts on the end of cover 374 distal from spacing bar 420 and is fed by a fluid supply tube 494 running through the mounting end of arm 372 and through spacing bar 420.

Rinse nozzles 416 mounted for example as shown in FIG. 11b to lever assemblies 414a–414c keep wafers 160 moist during the transport cycle until wafers 160 have been dried, as is typically required during post CMP (chemical-mechanical-polishing) wafer processing applications. Lever assembly 414d does not require a rinse nozzle, because its travel is between rinse/dry station module 106 and send module 462, after the surfaces of wafer 160 have been dried.

Referring to FIGS. 11a, 12, 13, transport housing 422 translates longitudinally along the center axis of spacing bar 420, parallel to module axis 458. Transport housing 422 is supported by a ball bushing assembly 446 that slides on a linear rail 424 and is driven typically by a linear motor 426. Linear rail 424 and linear motor 426 are attached to a frame assembly 442. Spacing bar 420 houses tubing and cabling routed from a utility harness 444 to individual lever assemblies 414a–414d and their respective mechanisms.

A cover 428 located below transport housing 422 collects fluids from rinse nozzles 416 and process modules 102, 104, 106 and discharges them into a waste double containment reservoir 430, in accordance with conventional practice. Cover 428 contains a slot (not shown) underlying transport housing 422, through which transport housing 422 mechanically communicates with ball bushing assembly 446. The slot is surrounded by a vertical lip (not shown), which together with the underside of transport housing 422 forms a baffle that prevents process fluids from entering the slot, thereby protecting linear rail 424 and linear motor 426 from exposure to and potential damage from chemicals and fluids.

FIGS. 14a–14h illustrate a typical operating sequence for a transport cycle of wafer transport apparatus 108.

FIG. 14a is an isometric view of wafer transport apparatus 108 in one end position at the beginning of a transport cycle (home position), in accordance with the present embodiment. Wafers 160 are contained in process modules 102, 104, 106 and in receive module 460. Lever assemblies 414a–414d are oriented vertically.

FIG. 14b is an isometric view of wafer transport apparatus 108 at a further stage of a transport cycle, in accordance with the present embodiment. Spacing bar 420 rotates lever assemblies 414a–414d by 90 degrees into a horizontal orientation, thereby rotating end effectors 412 into modules 460, 102, 104, 106 without interference and swiveling end effectors 412 into the open position to receive wafers 160.

FIG. 14c is an isometric view of wafer transport apparatus 108 at a further stage of the transport cycle, in accordance with the present embodiment. After lever assemblies 414a–414d are in a horizontal orientation, end effectors 412 swivel into the closed position, clamping wafers 160 on their edges into grooved cylinders 410. Rinse nozzles 416 aim at wafers 160 and dispense fluids (typically deionized water).

FIG. 14d is an isometric view of wafer transport apparatus 108 at a further stage of the transport cycle, in accordance with the present embodiment. Spacing bar 420 rotates lever assemblies 414a–414d back into a vertical orientation, carrying wafers 160 clear of modules 460, 102, 104, 106 (not shown). The relative position between wafers 160 and rinse nozzles 416 remains constant throughout the travel.

FIG. 14e is an isometric view of wafer transport apparatus 108 at a further stage of the transport cycle, in accordance with the present embodiment. Spacing bar 420 translates longitudinally by the width of one module 460, 102, 104, 106 (not shown), advancing all four wafers 160 simultaneously by one module width to positions adjacent their respective next modules. For example, the wafer previously in receive module 460 is moved adjacent first brush station module 102, the wafer previously in first brush station module 102 is moved adjacent second brush station module 104, the wafer previously in second brush station module 104 is moved adjacent rinse/dry module 106, and the wafer previously in rinse/dry module 106 is moved adjacent send module 462 (not shown), respectively. Rinse nozzles 416 maintain a constant position in relation to wafers 160.

FIG. 14f is an isometric view of wafer transport apparatus 108 at a further stage of the transport cycle, in accordance with the present embodiment. Spacing bar 420 again rotates lever assemblies 414a–414d into a horizontal orientation, thereby carrying wafers 160 into next modules 102, 104, 106, 462, respectively.

FIG. 14g is an isometric view of wafer transport apparatus 108 at a further stage of the transport cycle, in accordance with the present embodiment. After wafers 160 are securely engaged by the respective holding devices of next modules 102, 104, 106, 462, end effectors 412 swivel into the open position, thereby releasing wafers 160 from grooved cylinders 410. Rinse nozzles 416 may then be turned off.

FIG. 14h is an isometric view of wafer transport apparatus 108 at a further stage of the transport cycle, in accordance with the present embodiment. Spacing bar 420 rotates lever assemblies 414a–414d again into a vertical orientation. The next wafer cleaning and drying cycle can then start. Spacing bar 420 carrying lever assemblies 414a–414d translates back to the home position, as shown in FIG. 14a, to await the next transport cycle. The return to the home position may be performed simultaneously with all or part of the ongoing wafer cleaning and drying cycle, thereby reducing cycle time and increasing throughput.

At the beginning of a production cycle, only receive module 460 contains a wafer. In the first transport cycle, wafer transport apparatus 108 captures and transfers the single wafer from receive module 460 to first process module 102, 104, 106 as described above in connection with FIGS. 14a–14h. In the second transport cycle, wafer transport apparatus 108 captures and transfers the first wafer from first process module 102, 104, 106 to second process module 102, 104, 106 and simultaneously captures and transfers a second wafer from receive module 460 to first process module 102, 104, 106. In each successive transport cycle the wafer transport apparatus 108 transfers one additional wafer to one additional module, until each module 460, 102, 104, 106, 462 contains a wafer. At the end of a production cycle wafer transport apparatus 108 transfers one fewer wafer in each successive transport cycle, until only send module 462 contains a wafer.

Wafer transport apparatus 108, in accordance with the embodiment, provides efficiency by transferring multiple wafers simultaneously among multiple process modules 102, 104, 106. It occupies a minimal footprint without interference with process modules 102, 104, 106. It provides for a continuous wafer rinse capability with constant relative position between wafer and rinse nozzle throughout the transport cycle. Return of spacing bar 420 with attached lever assemblies 414a–414d to its home position during an ongoing cleaning and drying cycle reduces wafer transport overhead and increases throughput. End effectors can easily be interchanged for flexibility to accommodate different wafer sizes and shapes.

In an alternative version of the embodiment, end effectors 412 may be replaced partially or altogether by conventional vacuum end effector assemblies (e.g. holding the wafer surface under air pressure), without substantially changing the function or the structure of wafer transport apparatus 108. However, as is known in the art, this method has inferior reliability for handling wet and slippery wafers.

In a further alternative version of the embodiment, linear motor 426 may be replaced by a pneumatic cylinder. Likewise stepper motor 440 may be replaced by a rotary pneumatic cylinder, resulting potentially in an entirely pneumatically driven wafer transport apparatus 108. It is understood that all cleaning, rinsing, drying, and transport functions of wafer cleaning and drying apparatus 100 are preferably controlled by software, although alternative methods may be used in whole or in part.

Although a system is described, it is to be understood that the embodiments comprise each module thereof individually. Having thus described the principles of the invention, together with several illustrative embodiments thereof, it is to be understood that, although specific terms are employed, they are used in a generic and descriptive sense, and not for the purpose of limitation, the scope of the invention being set forth in the following claims.

What is claimed is:

1. A wafer cleaning and drying apparatus comprising:
    a wafer drive assembly for supporting and rotating about a rotation axis a semiconductor wafer having a planar surface, said planar surface oriented in a vertical plane and said rotation axis aligned perpendicular to said planar surface;
    two substantially tubular wafer cleaning brushes comprising sponges beltwise rotatable about axes parallel to said planar surface, such that a first sponge mounted on a first wafer cleaning brush rotates in a first direction and contacts a first planar surface of said wafer, and a second sponge mounted on a second wafer cleaning brush rotates in a second direction opposite said first direction and contacts a second planar surface of said wafer, said wafer cleaning brushes disposed symmetrically with respect to a midplane of said wafer;
    said first wafer cleaning brush comprising a first brush shaft and a second brush shaft, said brush shafts being rotatable about mutually parallel axes and spaced laterally from each other by an adjustable distance; and
    said first brush shaft and said second brush shaft being mounted within a lumen of said first sponge.

2. The apparatus according to claim 1, wherein said first wafer cleaning brush further comprises at least one fluid delivery tube mounted within said lumen of said sponge, said fluid delivery tube being nonrotating and aligned parallel with said first brush shaft and said second brush shaft and containing perforations along substantially the lengths of said brush shafts.

3. The apparatus according to claim 1, wherein said adjustable distance is adjustable laterally using adjustment screws and alignment dowel pins.

4. The apparatus according to claim 1, wherein said first wafer cleaning brush is coupled to a swivel axis concentric with said first brush shaft.

5. The apparatus according to claim 1, wherein said wafer drive assembly comprises a rotatable ring assembly incorporating means for clamping said wafer in a plane offset from and parallel to the plane of said ring assembly.

6. The apparatus according to claim 5, wherein said means for clamping comprises a preloaded torsion spring lever.

7. The apparatus according to claim 5, wherein said wafer drive assembly further comprises three rolls, said ring assembly circumferentially contacting said three rolls, and one roll of said three rolls applying rotational motion to said ring assembly.

8. The apparatus according to claim 5, wherein said ring assembly is interchangeable with other ring assemblies in said wafer drive assembly.

9. The apparatus according to claim 1, further comprising a rinse/dry chamber incorporating:

a fluid containment enclosure having an inner surface and fluid supply and drain connections;

a support member for holding said wafer stationary within said enclosure, such that said wafer is immersible in fluid and such that all points on said planar surfaces of said wafer are located at a distance no greater than six millimeters from said inner surface;

a first portion separable from a second portion of said enclosure, said enclosure opening by translating said first portion relative to said second portion; and at least one fluid dispensing nozzle adjacent and directed toward said inner surface of said enclosure and said wafer, when said enclosure is open.

10. The apparatus according to claim 1, further comprising a wafer transport assembly incorporating:

a substantially cylindrical member rotationally mounted in a housing, said substantially cylindrical member having a longitudinal axis, and said housing being translatable parallel to said longitudinal axis;

at least two substantially parallel members each interconnected radially to said substantially cylindrical member through a mounting/alignment block, said mounting/alignment block enabling alignment between each of said at least two substantially parallel members and said substantially cylindrical member; and an end effector connected to each of said at least two substantially parallel members, said end effector incorporating releasable means for holding a semiconductor wafer in a precise position and orientation relative to a respective said substantially parallel member.

11. The apparatus according to claim 10, wherein said end effector is swivelably and demountably connected to a respective said substantially parallel member.

12. The apparatus according to claim 10, wherein said releasable means comprises at least one grooved cylinder attached to said end effector.

13. The apparatus according to claim 10, further comprising a fluid dispensing nozzle attached to at least one of said at least two substantially parallel members.

14. A wafer cleaning brush comprising:

a first brush shaft and a second brush shaft, said brush shafts being rotatable about mutually parallel axes and spaced laterally from each other by an adjustable distance;

said brush shafts being mounted within a lumen of a substantially tubular sponge; and at least one fluid delivery tube being mounted within said lumen of said sponge, said fluid delivery tube being nonrotating and aligned parallel with said brush shafts and containing perforations along substantially the lengths of said brush shafts.

* * * * *